United States Patent [19]
Nilssen

[11] Patent Number: 5,640,069
[45] Date of Patent: Jun. 17, 1997

[54] MODULAR LIGHTING SYSTEM

[76] Inventor: Ole K. Nilssen, PH4, 257 Lely Beach Blvd., Bonita Springs, Fla. 33923

[21] Appl. No.: 598,269

[22] Filed: Feb. 7, 1996

Related U.S. Application Data

[63] Continuation-in-part of Ser. No. 326,197, Oct. 20, 1994, Pat. No. 5,459,375, and a continuation-in-part of Ser. No. 531,481, Sep. 21, 1995, and a continuation-in-part of Ser. No. 330,605, Oct. 28, 1994, Pat. No. 5,481,160, which is a continuation of Ser. No. 20,696, Feb. 22, 1993, abandoned, said Ser. No. 531,481, is a continuation-in-part of Ser. No. 459,732, Jun. 2, 1995, which is a continuation-in-part of Ser. No. 220,520, Mar. 31, 1994, Pat. No. 5,426,347, which is a continuation-in-part of Ser. No. 47,944, Apr. 16, 1993, Pat. No. 5,491,385, which is a continuation-in-part of Ser. No. 955,229, Oct. 1, 1992, Pat. No. 5,233,270, which is a continuation-in-part of Ser. No. 607,271, Oct. 31, 1990, which is a continuation-in-part of Ser. No. 787,692, Oct. 15, 1985, which is a continuation of Ser. No. 644,155, Aug. 27, 1984, which is a continuation of Ser. No. 555,426, Nov. 23, 1983, which is a continuation of Ser. No. 178,107, Aug. 14, 1980, said Ser. No. 220,520, is a continuation-in-part of Ser. No. 62,329, May 17, 1993, which is a continuation of Ser. No. 700,049, May 8, 1991, which is a continuation of Ser. No. 489,096, Apr. 27, 1983, which is a continuation-in-part of Ser. No. 178,107, Aug. 14, 1980.

[51] Int. Cl.$^6$ .................................................. H05B 37/02
[52] U.S. Cl. ..................... 315/209 R; 315/219; 315/361
[58] Field of Search ............................. 315/209 R, 219, 315/312, 318, 361

[56] References Cited

U.S. PATENT DOCUMENTS 5,194,858  3/1993  Erwin ........................... 315/361
5,291,299  3/1994  Karina .......................... 315/361

*Primary Examiner*—Frank G. Font
*Assistant Examiner*—Reginald A. Ratliff

[57] ABSTRACT

A fluorescent lighting system has: (A) a central power supply connected with regular power line voltage and including a number of power supply modules (e.g., eight), each such module having: (i) a parallel-resonant self-oscillating bridge inverter operative to provide a 35 kHz sinusoidal output voltage at a pair of primary output terminals; (ii) a tank-inductor and a tank-capacitor parallel-connected across the primary output terminals; and (iii) several (e.g., four) pairs of secondary output terminals, each connected with the primary output terminals via its own dedicated current-limiting sub-circuit; thereby to prevent a load connected with a pair of secondary output terminals from drawing more than a certain amount of power; thereby, in turn, to render each pair of secondary output terminals fire-hazard-safe; (B) a plurality of lighting fixtures (e.g., 32), each having a fluorescent lamp and a power input receptacle; each lighting fixture also including a power-factor-corrected 35 Khz ballast connected between its power input receptacle and its fluorescent lamp; and (C) a light-weight power cord plug-in-connected between the power input receptacle of each lighting fixture and one of the pairs of power output terminals. Thus, a single central multi-port power supply will serve to power a large number (e.g., 32) lighting fixtures, with each individual lighting fixture connected directly with one of the many (e.g., 32) individual pairs of secondary power output terminals of the central power supply.

34 Claims, 14 Drawing Sheets

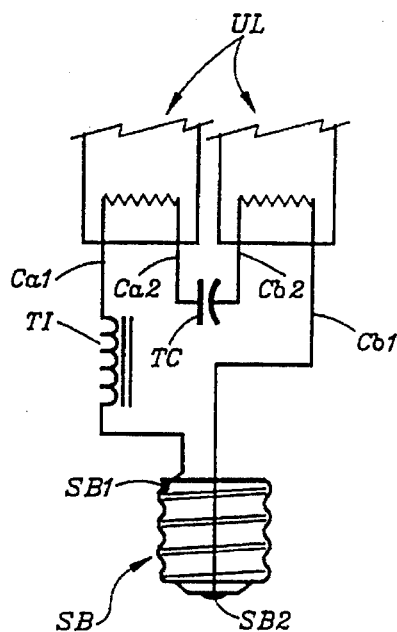
Fig. 3a
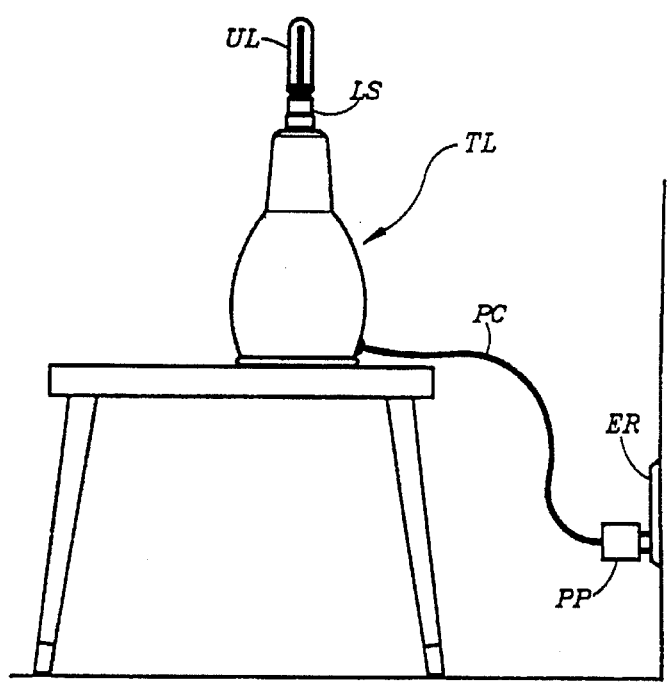
Fig. 1
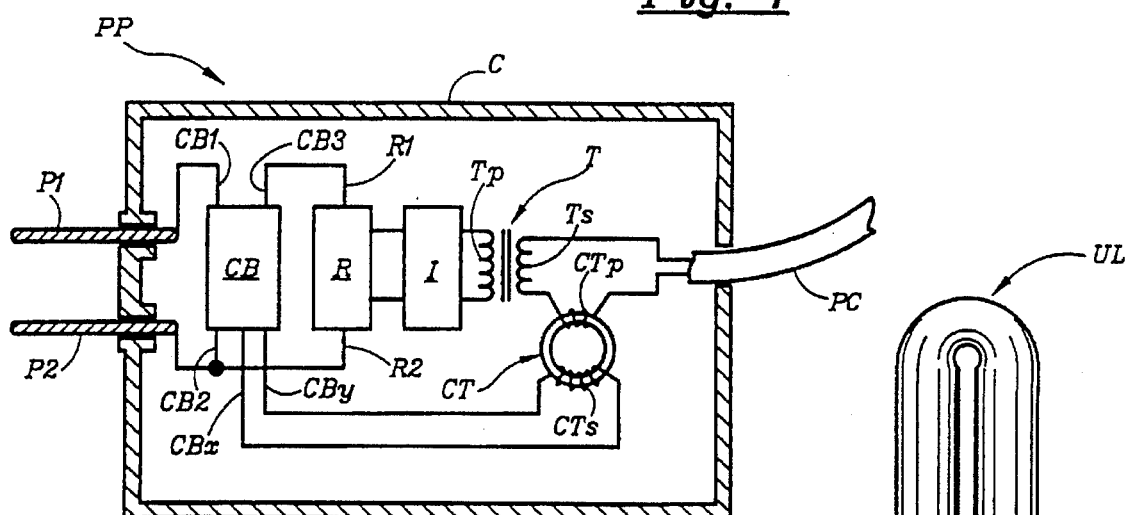
Fig. 2
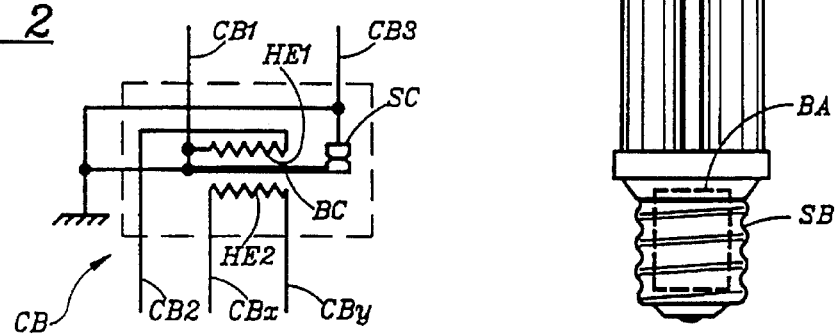
Fig. 2a
Fig. 3

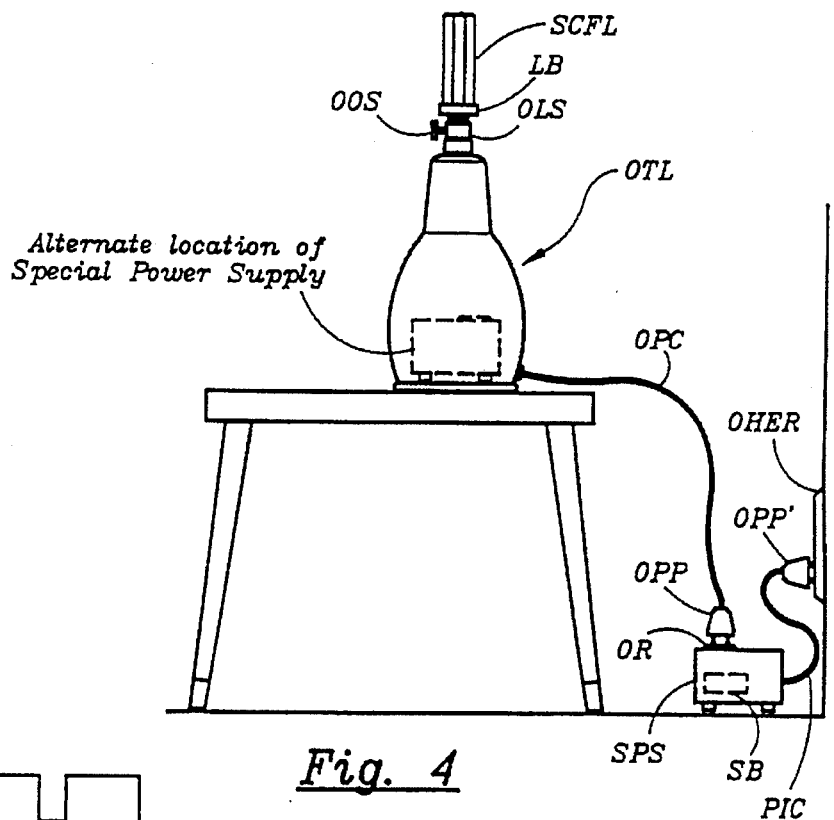
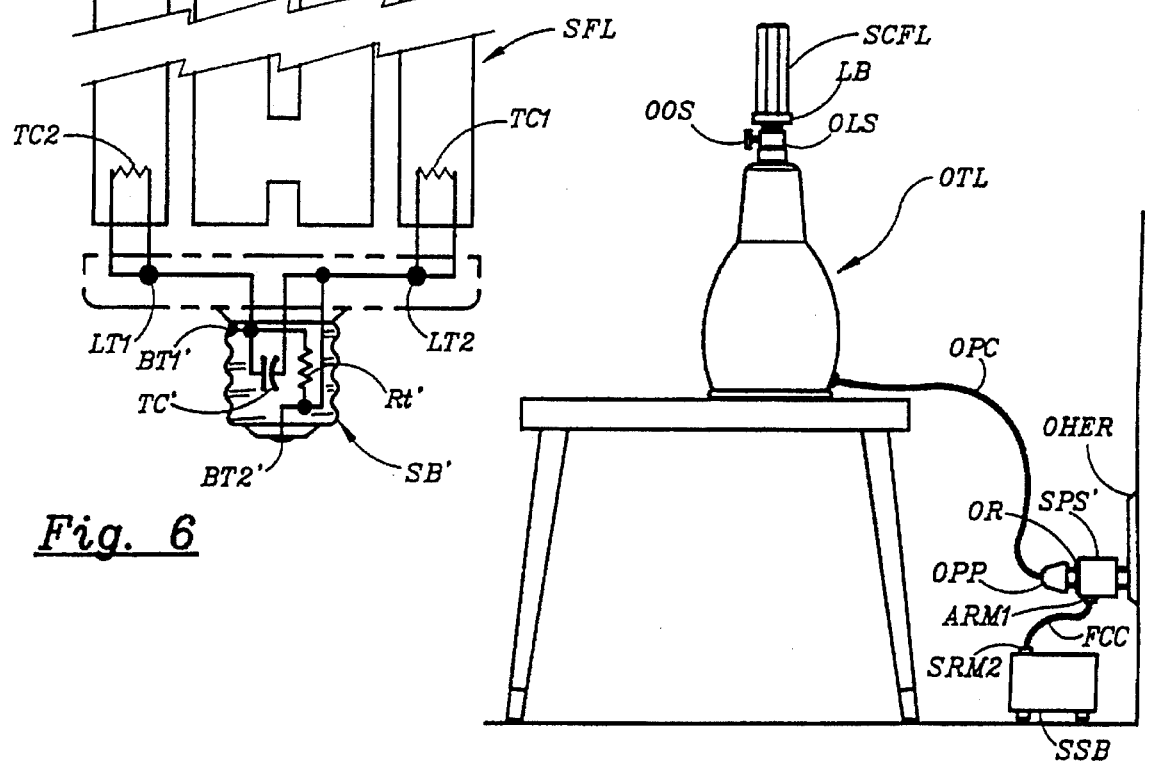
Fig. 4
Fig. 6
Fig. 7

MODULAR LIGHTING SYSTEM

BACKGROUND OF THE INVENTION

Related Applications

Instant application is a Continuation-in-Part of Ser. No. 08/531,481 filed Sep. 21, 1995; which is a Continuation-in-Part of Ser. No. 08/459,732 filed Jun. 2, 1995; which is a continuation-in-part of Ser. No. 08/220,520 filed Mar. 31, 1994, now U.S. Pat. No. 5,426,347; which is a Continuation-in-Part of application Ser. No. 08/047,944 filed Apr. 16, 1993; now U.S. Pat. No. 5,491,385, which is a Continuation-in-Part of Ser. No. 07/955,229 filed Oct. 1, 1992; now U.S. Pat. No. 5,233,270, which is a Continuation-in-Part of Ser. No. 07/607,271 filed Oct. 31, 1990; which is a Continuation-in-Part of Ser. No. 06/787,692 filed Oct. 15, 1985; which is a Continuation of Ser. No. 06/644,155 filed Aug. 27, 1984; which is a Continuation of Ser. No. 06/555,426 filed Nov. 23, 1983; which is a Continuation of Ser. No. 06/178,107 filed Aug. 14, 1980.

Application Ser. No. 08/220,520 is also a Continuation-in-Part of Ser. No. 08/062,329 filed May 17, 1993; which is a Continuation of Ser. No. 07/700,049 filed May 8, 1991; which is a Continuation of Ser. No. 06/489,096 filed Apr. 27, 1983; which is a Continuation-in-Part of Ser. No. 06/178, 107 filed Aug. 14, 1980.

Instant application is also a Continuation-in-Part of Ser. No. 08/330,605 filed Oct. 28, 1994; now U.S. Pat. No. 5,481,160, which is a Continuation of Ser. No. 08/020,696 filed Feb. 22, 1993, now abandoned.

Instant application is also a Continuation-in-Part of Ser. No. 08/326,197 filed Oct. 20, 1994, now U.S. Pat. No. 5,459,375.

FIELD OF THE INVENTION

Instant invention relates to the field of power-line-operated gas discharge lighting products and systems.

SUMMARY OF THE INVENTION

Objects of the Invention

An object of the present invention is that of providing power-line-operated lighting product and systems that exhibit improved cost-effectiveness as compared with presently available lighting products and systems.

This as well as other objects, features and advantages of the present invention will become apparent from the following description and claims.

BRIEF DESCRIPTION OF A FIRST INITIALLY PREFERRED EMBODIMENT

In a first initially preferred embodiment, subject invention is an ordinary so-called table lamp (or floor lamp), except as follows:
  (a) it has a more flexible light-weight power cord, said power cord having a pair of conductors; and
  (b) it has a somewhat larger-than-normal power plug at the end of its power cord, said power plug having a pair of prongs for insertion into an ordinary household electrical receptacle and comprising the following assembly:
    a rectifier means connected with said pair of prongs and operative, whenever the power plug is inserted into the electrical receptacle, to provide a DC voltage output;
    an inverter connected with said DC voltage output and operative to provide an AC voltage output of 30 kHz frequency;
    a transformer connected in circuit with said AC voltage output and operative to provide a power-line-isolated low-magnitude (30 Volt RMS) high-frequency (30 kHz) voltage at a pair of output terminals, said pair of output terminals being connected with said pair of conductors in the light-weight power cord; and
    disable means connected in circuit with said pair of output terminals and operative to sense the magnitude of the output current drawn therefrom, said disable means being operative to disable the inverter in case this output current exceeds a pre-determined magnitude for more than a brief time-period;
    whereby the socket in the table lamp is provided with a power-line-isolated power-limited low-magnitude high-frequency AC voltage.

Also, the first initially preferred embodiment includes a fluorescent lamp mounted on an ordinary Edison-type screw-base and adapted to be screwed into and powered from the lamp socket in the table lamp. This fluorescent lamp is self-ballasted for 30 kHz operation—with the ballast therefore being so small as to permit it to be contained substantially within the screw-base.

BRIEF DESCRIPTION OF A SECOND INITIALLY PREFERRED EMBODIMENT

In the second initially preferred embodiment, the invention includes the following key elements.
  (a) A power supply is plugged into an ordinary household electrical outlet and is functional to provide a high frequency current at a power receptacle operative to receive the power plug of an ordinary table lamp.
  (b) This ordinary table lamp has a special compact fluorescent lamp screwed into its lamp socket.
  (c) Provided the special fluorescent lamp is indeed screwed into the lamp socket, and provided the lamp's switch is in its ON position, the power supply does in fact supply the high frequency current from its power receptacle.
  (d) The high frequency current powers the compact special fluorescent lamp at a predetermined power level, thereby to provide for high-efficacy luminous output.
  (e) A storage battery contained within the special power supply [or, in an alternative version, located outside of and plug-in-connected with the special power supply] is kept fully charged by current derived from the power line voltage normally present at the electrical outlet and functions such as to cause high frequency current to be supplied from the output receptacle even if the power line voltage were to be disrupted.
  (f) To prolong the duration over which the battery can power the fluorescent lamp to a useful light output level, the magnitude of the power provided to the lamp during power failure may be reduced compared with the predetermined level.

BRIEF DESCRIPTION OF A THIRD INITIALLY PREFERRED EMBODIMENT

In the third initially preferred embodiment, the invention may briefly be described as an arrangement including the following elements.
  (a) a central power-line-operated frequency-converting power supply characterized by including: (i) a parallel-resonant self-oscillating bridge inverter operative to provide a high-frequency (e.g., 35 kHz) sinusoidal output voltage at a pair of primary output terminals; (ii) a tank-inductor and a tank-capacitor effectively parallel-connected across the primary output terminals; and (iii) plural pairs of secondary output terminals, each connected with the primary output terminals via its own dedicated current-limiting sub-circuit; thereby to prevent a load connected therewith from drawing more than a predetermined low-level amount of power; thereby, in turn, to render each pair of secondary output terminals fire-hazard-safe and shock-hazard-safe in accordance with the requirements of the National Electrical Code; each pair of secondary power output terminals being connected with its own power output receptacle; and (b) plug-in connected with each power output receptacle is a light-weight power cord with a pair of power conductors between which are connected a number of individually ballasted lighting units; each lighting unit having at least one gas discharge lamp as well as a high-frequency high-power-factor ballasting assembly—with the ballasting assembly including a tuned parallel-connected LC circuit having a natural resonance frequency equal to that of the high-frequency output voltage provided from the central power supply.

Due to having each lighting unit parallel-resonant at the frequency of the high-frequency output voltage, the drastic frequency change (and the concomitant loss in light output) usually occurring when adding several separately ballasted lamp loads to the output of a parallel-resonant self-oscillating power supply will not occur; which is to say, the effect usually seen in connection with a self-oscillating parallel-resonant ballast adapted to parallel-power plural fluorescent lamps—which effect is that of seeing a significant reduction in the light output per lamp as lamps are added—will not exist in the above-described embodiment of the present invention.

In a first anticipated application, the invention is implemented in the form of a multi-port power-limited power supply plug-in-connected with an ordinary household electrical receptacle and having several output receptacles, each adapted to receive and hold an ordinary power plug, such as from an ordinary table lamp into whose lamp socket is screwed a compact fluorescent lamp that includes its own very tiny high-frequency high-power-factor parallel-resonant ballast.

In a second anticipated application, the invention is implemented in the form of a plug-mounted/connected power supply having plural parallel-connected female-type output ports, with each port being adapted to receive/hold a small male-type plug at one end of a light-weight cord, whose other end is plug-in-connected with a first lamp structure mounted on a flat surface, such as under a cabinet. At the down-stream end of this first lamp structure is a female-type output port into which is plugged a second lamp structure, perhaps (but not necessarily) identical to the first lamp structure. Each lamp structure includes its own very tiny high-frequency parallel-resonant ballasting device and provides for direct connection between its male-type input port and its female-type output port, thereby permitting any number of such lamp structures to be plugged into one another—with the only limit to the number of lamp structures so connected being determined by the maximum power available from the output port(s) of the power supply.

In a third anticipated application, the invention is implemented in the form of a central multi-port high-frequency power supply hard-wired to the power line and fixtured to the permanent ceiling above a suspended ceiling in which is placed plural non-fixtured lighting panels, each with a small built-in high-frequency high-power-factor parallel-resonant ballasting sub-circuit. The central power supply typically has four separate high-frequency power output ports; each individual power output port exhibiting manifest magnitude limitation in terms of the maximum current extractable therefrom, thereby constituting a so-called Class-2 or Class-3 fire-initiation-safe or fire-hazard-safe output. Each power output port is represented by a female-type receptacle operative to receive and hold a male-type power plug at one end of a flexible light-weight power cord, whose other end has a female-type plug operative to be received and held by a matching male-type receptacle on a lighting panel mounted in the suspended ceiling in a location below and proximate to the central power supply. Each lighting panel typically has several fluorescent lamps, each powered from the small built-in high-frequency ballasting sub-circuit.

In a fourth anticipated application, a central multi-port high-frequency power supply powers, in a fire/shock-hazard-safe manner, by way of a light-weight flexible plug-in-connected power cord, a remotely located neon sign, which has a small built-in high-frequency high-power-factor parallel-resonant ballasting sub-circuit that is integrally combined with the high-voltage transformer required for powering the sign's neon tube(s). In this application, it is particularly important that the waveform of the high-frequency voltage provided from the central power supply is indeed sinusoidal.

In a fifth anticipated application, a central high-frequency power supply powers, in a fire/shock-hazard-safe manner, by way of a light-weight flexible plug-in-connected power cord, a number of neon sign modules, each representing an individual alpha-numeric symbol (i.e., a letter or a numeral), and each having a built-in tiny high-frequency ballasting sub-circuit. Each of these alpha-numeric symbols may, optionally: (i) be individually connected with and supported by a pair of distribution conductors (provided in the form of a so-called power track—such as used in track lighting systems) distributing high-frequency sinusoidal voltage from the output port of the central power supply; or (ii) be plugged into one another in the manner disclosed in the above-described second anticipated application.

In a sixth anticipated application, a central high-frequency power supply is integrally combined with a lighting fixture that is hard-wired to the power line. While this power supply powers the fixture's own fluorescent lamps, it also provides fire/shock-hazard-safe high-frequency output voltage from each of plural separate power output ports, to each of which may be connected a lighting panel of the type disclosed in connection with the above-described third anticipated application.

In a seventh anticipated application, a central high-frequency power supply is plug-mounted (or pole/spike-mounted) and includes one or more fire-hazard-safe and/or shock-hazard-safe power output ports, each providing high-frequency sinusoidal voltage to a pair of light-weight flexible distribution conductors to which is connected, in a manner such as described in connection with the above-disclosed fifth anticipated application, a plurality of decorative low-power lighting units, such as are appropriate for: (i) an outdoor decorative lighting system (e.g., like a so-called Maliby-type system); (ii) a decorative lighting system for an outdoor wooden deck; (iii) an outdor walkway lighting and/or marking system; (iv) an indoor decorative lighting system; and (v) etc.

In an eighth anticipated application, a central multi-port high-frequency power supply is plug-connectable with an ordinary household electrical receptacle. Into each fire/shock-hazard-safe power output port is plugged a male-type special plug which connects to a luminaire that, by a do-it-yourself'er with only minimal skills, can easily and safely be permanently mounted in or on ceilings/walls/etc. in a home. Each luminaire includes a small built-in high-frequency parallel-resonant high-power-factor ballasting sub-circuit connected with the luminaire's fluorescent lamps as well as with a female-type power input port, which would be plug-in-connected with one of the Class-2 (i.e., fire/shock-hazard-safe) output ports of the central power supply by way of a light-weight bell-wire-type power cord that can be safely routed in whatever convenient manner might be chosen by the do-it-yourselfer.

BRIEF DESCRIPTION OF THE PRESENTLY PREFERRED EMBODIMENT

In the presently preferred embodiment, the invention may briefly be described as a fluorescent lighting system that has:

(A) a central power supply connected with a source of regular power line voltage and including a number of power supply modules (e.g., eight), each such module having: (i) a parallel-resonant self-oscillating bridge inverter operative to provide a 35 kHz sinusoidal output voltage at a pair of primary output terminals; (ii) a tank-inductor and a tank-capacitor parallel-connected across the primary output terminals; and (iii) several (e.g., four) pairs of secondary output terminals, each connected with the primary output terminals via its own dedicated current-limiting sub-circuit; thereby to prevent a load connected with a pair of secondary output terminals from drawing more than a certain amount of power; thereby, in turn, to render each pair of secondary output terminals fire-hazard-safe;

(B) a plurality of lighting fixtures (e.g., 32), each having a fluorescent lamp and a power input receptacle; each lighting fixture also including a power-factor-corrected 35 Khz ballast connected between its power input receptacle and its fluorescent lamp; and (C) a light-weight power cord plug-in-connected between the power input receptacle of each lighting fixture and one of the pairs of power output terminals.

Thus, a single central multi-port power supply will serve to power a large number (e.g., 32) lighting fixtures, with each individual lighting fixture connected directly with one of the many (e.g., 32) individual pairs of secondary power output terminals of the central power supply.

In other words, a single central modular power supply serves to power all of the many lighting fixtures in the ceiling of a relatively large room in an office building. The only thing requiring a professional electrician for installation is the central power supply; all the other elements of the lighting system can be properly and safely be installed by non-skilled personnel; all of which means that the net total cost per installed lighting fixture will be very substantially reduced. Otherwise, each individual lighting fixture needs to be installed by a professional electrician.

Also, because each lighting fixture is powered from a fire-initiation-safe source, it can be constructed to be far lighter in weight and of much lower cost.

BRIEF DESCRIPTION OF THE DRAWINGS

FIG. 1 schematically illustrates a table lamp according to the first initially preferred embodiment of the invention.

FIGS. 2 and 2A schematically illustrate the inverter-type power supply comprised within the power plug on the end of the power cord of the table lamp of FIG. 1.

FIGS. 3 and 3A schematically illustrates a high-frequency-ballasted screw-in fluorescent lamp suitable for direct insertion and operation in the lamp socket of the table lamp of FIG. 1.

FIG. 4 schematically illustrates a first version of the second initially preferred embodiment of the invention.

FIG. 6 schematically illustrates the compact screw-in fluorescent lamp used in the embodiment of FIG. 4.

FIG. 7 schematically illustrates a modification of the embodiment illustrated in FIG. 4.

DESCRIPTION OF THE FIRST INITIALLY PREFERRED EMBODIMENT

Figure 5:
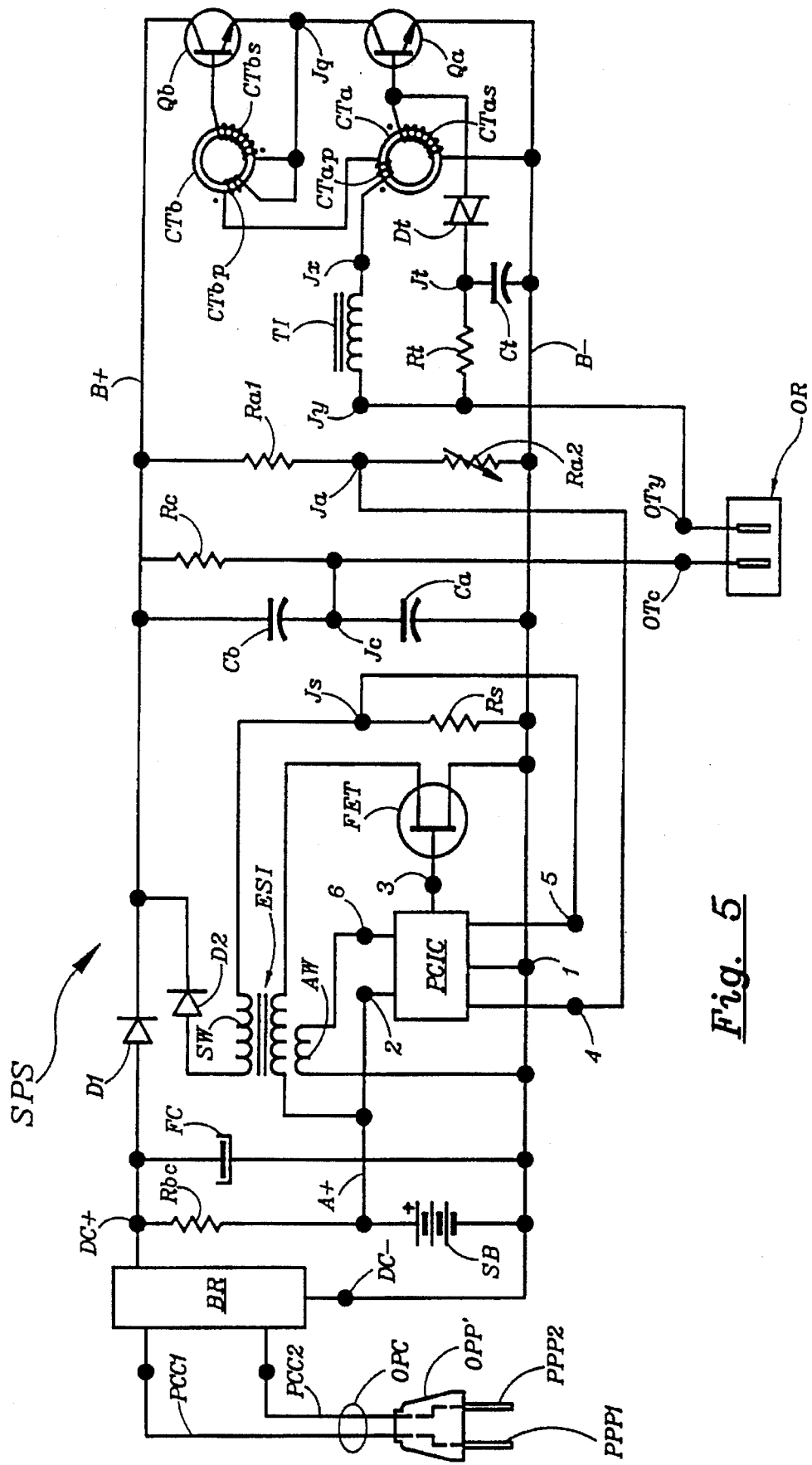
FIG. 5 schematically illustrates the power supply used in the embodiment of FIG. 4.

Re Construction of First Initially Preferred Embodiment

FIG. 1 shows an ordinary table lamp TL with a two-conductor power cord PC. At the end of this power cord is mounted a somewhat-larger-than-normal power plug PP. This power plug, which comprises electronic circuitry in accordance with the schematic illustration of FIG. 2, is plugged into an ordinary household electrical receptacle ER.

The table lamp has an Edison-type screw-in lamp socket LS, into which is screwed a high-frequency-ballasted U-shaped fluorescent lamp UL of the type schematically illustrated in FIG. 3.

FIG. 2 schematically illustrates the power plug PP, which comprises a case or container means C on which is rigidly mounted a pair of electrical terminal prongs P1 and P2, which prongs are adapted for insertion into an electrical receptacle, such as ER of FIG. 1.

A circuit breaker CB is connected with a first terminal CB1 to prong P1 and with a second terminal CB2 to prong P2. A rectifier means R is connected with its two input terminals, R2 and R1, respectively, with prong P2 and a third terminal CB3 on circuit breaker CB.

The DC output voltage from R is applied to an inverter I; the output from which is, in turn, applied to the primary winding Tp of a ferrite transformer T. The output from this transformer's secondary winding Ts is applied to the power cord PC by way of primary winding CTp of current transformer CT.

The output from the secondary winding CTs of current transformer CT is applied to control terminals CBx and CBy of circuit breaker CB.

Details of circuit breaker CB are illustrated in FIG. 2a, where is shown a bi-stable bi-metallic bender/contactor BC connected with terminal CB1 and a stationary contactor SC connected with terminal CB3. This circuit breaker is shown in its unactivated position, which is a normally-closed position.

Two resistive heating elements HE1 and HE2 are thermally connected with the bender/contactor. Heating element HE1 is connected directly between terminals CB1 and CB2; and heating element HE2 is connected directly with control terminals CBx and CBy.

FIG. 3 illustrates a U-shaped fluorescent lamp UL mounted on a regular Edison-type screw-base SB. Mounted within this screw-base is a high-frequency fluorescent lamp ballasting arrangement BA, details of which are schematically illustrated in FIG. 3a.

In FIG. 3a, connected between terminal SB1 of screw-base SB and cathode terminal Ca1 of fluorescent lamp UL is a tank-inductor TI. A tank-capacitor TC is connected between cathode terminals Ca2 and Cb2. Cathode terminal Cb1 is connected directly with screw-base terminal SB2.

Re Operation of First Initially Preferred Embodiment

The operation of the table lamp means TL of FIG. 1 is completely analogous to that of any ordinary table lamp, except that this particular table lamp is provided with a special power plug PP; which special power plug provides for a 30-Volt/30-kHz current-limited AC voltage to be supplied to its lamp socket LS—as contrasted with the 120-Volt/60-Hz non-current-limited AC voltage normally provided for such lamp sockets. Thus, lamps (light-bulbs) to be used with table lamp TL—whether they be incandescent or gas-discharge lamps—must be adapted to operate properly with this special 30-Volt/30-kHz AC voltage.

For instance, the fluorescent lamp of FIG. 3 is adapted to operate properly in the socket of the table lamp of FIG. 1. This fluorescent lamp is intended for proper operation on a 30-Volt/30-kHz AC voltage; and it is ballasted by way of resonant interaction between a tank-inductor TI and a tank-capacitor TC, which inductor and capacitor are resonant at 30 kHz.

(Due to the so-called Q-multiplication of resonant circuits, it is readily possible—without use of transformer means—to properly operate relatively high-voltage fluorescent lamps from relatively low-voltage supplies.)

In a general sense, resonant ballasting of fluorescent lamps is described in published literature and need not be described in further detail herein. However, its application to a self-contained screw-in fluorescent lamp is not previously described, and offers at least one particularly attractive feature, as follows.

If the lamp of FIG. 3 be screwed into a lamp socket with the normal 120-Volt/60-Hz non-current-limited voltage applied thereto, it will not be damaged in that the tank capacitor acts as a very high impedance for 60-Hz current.

The operation of the high-frequency (30 kHz) power supply comprised within the power plug PP is substantially conventional, except as follows.

The circuit breaker is of a bi-stable kind and normally provides for direct contact between prong P1 and terminal R1 of rectifier R; which then provides for power to sustain operation of the inverter I.

Heating element HE1 is powered directly from the full line voltage; but the amount of heat generated by HE1 is insufficient by itself to open the contact between bender/contactor BC and stationary contactor SC. However, due to the bi-stable nature built into the bimetallic bender/contactor, the amount of heat generated by HE1 is sufficient to keep BC from re-contacting with SC once the two have been separated.

Thus, to cause circuit breaker CB to open in the first place, it is necessary that enough additional heat be furnished by heating element HE2; and, by way of routine design procedures, it has been arranged for enough additional heat to be furnished by HE2 at the point when the current flowing from power plug PP to power cord PC exceeds a chosen safe limit—which limit was chosen to be 3.3 Ampere in this preferred embodiment.

The main purpose of transformer CT is that of providing for effective electrical isolation between the power line and the output of PP.

Of course, if heating element HE2 is well isolated from bender/contactor BC, proper power-line-isolation can be attained without the need of transformer CT.

Additional Comments re First Initially Preferred Embodiment (a) Due to the resonant ballasting method, the current drawn by the fluorescent lamp of FIG. 3, when used in the table lamp of FIG. 1, is substantially sinusoidal and in phase with the fundamental component of the squarewave voltage provided from the plug-mounted power supply.

(b) It should be noted that a lighting product powered by way of the special cord-and-plug arrangement illustrated in FIGS. 1 and 2 can have any number of lamp sockets and operate with any number of fluorescent and/or incandescent lamps—the only limitation being that the total amount of power drawn not exceed the capacity of the plug-mounted power supply.

DESCRIPTION OF SECOND INITIALLY PREFERRED EMBODIMENTS

Re Construction of Second Initially Preferred Embodiments

FIG. 4 schematically illustrates a first version of the second initially preferred embodiment.

In FIG. 4, an ordinary table lamp OTL has an ordinary lamp socket OLS with an ON/OFF switch OOS and an ordinary power cord OPC at the end of which is an ordinary power plug OPP adapted to plug into any ordinary household electric receptacle, such as OHER.

A special power supply SPS has a power input cord PIC at the end of which is an ordinary power plug OPP' plugged into ordinary household electrical receptacle OHER. Special power supply SPS also has an output receptacle OR into which ordinary power plug OPP is plugged.

A special compact fluorescent lamp SCFL has a lamp base LB screwed into ordinary lamp socket OLS.

FIG. 5 schematically illustrates the special power supply SPS used in the arrangement of FIG. 4.

In FIG. 5, ordinary power cord OPC is shown to have power cord conductors PCC1 and PCC2 connected respectively with power plug prongs PPP1 and PPP2 of ordinary power plug OPP'; which is actually plugged into ordinary household electrical receptacle OHER of FIG. 4.

Power cord conductors PCC1/PCC2 are connected with the AC input terminals of a bridge rectifier BR, which has a pair of DC output terminals DC- and DC+ connected respectively with a B- bus and the anode of a diode D1, whose cathode is connected with a B+ bus. A filter capacitor FC is connected between the DC- terminal and the DC+ terminal.

A first capacitor Ca is connected between the B- bus and a junction Jc; and a second capacitor Cb is connected between junction Jc and the B+ bus. A first transistor Qa is connected with its emitter to the B- bus and with its collector to a junction Jq; to which junction Jq is connected the emitter of a second transistor Qb, whose collector is connected with the B+ bus.

Primary windings CTap and CTbp of current transformers CTa and CTb, respectively, are series-connected between junction Jq and a junction Jx. The terminals of secondary winding CTas of current transformer CTa are connected across the base and the emitter of transistor Qa; while the terminals of secondary winding CTbs of current transformer CTb are connected across the base and the emitter of transistor Qb.

A tank inductor TI is connected between junction Jx and a junction Jy; which junction Jy is connected with output terminal OTy; which output terminal OTy represents one of the output terminals of output receptacle OR; whose other output terminal is OTc, which is connected to junction Jc. A resistor Rc is connected between junction Jc and the B+ bus.

A resistor Rt is connected between junction Jy and a junction Jt; a capacitor Ct is connected between junction Jt and the B- bus; and a Diac Dt is connected between junction Jt and the base of transistor Qa.

A storage battery SB is connected with its negative terminal to the B- bus and with its positive terminal to an A+ bus. An energy-storing inductor ESI is connected between the A+ bus and the drain terminal of a field effect transistor FET, whose source terminal is connected with the B- bus. A secondary winding SW, which is tightly coupled with energy-storing inductor ESI, is connected between a junction Js and the anode of a diode D2, whose cathode is connected with the B+ bus. A resistor Rs is connected between junction Js and the B- bus.

A resistor Ra1 is connected between junction Ja and the B+ bus; and an adjustable resistor Ra2 is connected between junction Ja and the B- bus. Also, a resistor Rbc is connected between the DC+ terminal and the A+ bus.

A pre-converter integrated circuit PCIC has terminals 1 through 6, of which: terminal 1 is connected with the B- bus; terminal 2 is connected with the A+ bus; terminal 3 is connected with the gate terminal of transistor FET; terminal 4 is connected with junction Ja; terminal 5 is connected with junction Js; and terminal 6 is connected with one terminal of an auxiliary winding AW on energy-storing inductor ESI. The other terminal of auxiliary winding AW is connected with the B- bus.

FIG. 6 schematically illustrates the special compact fluorescent lamp SCFL of FIG. 4.

In FIG. 6, screw-base SB' has a first base terminal BT1' and a second base terminal BT2', with which base terminals are connected lamp terminals LT1 and LT2, respectively.

A tank capacitor TC' and a resistor Rt' are connected between lamp terminals LT1 and LT2.

A special fluorescent lamp SFL has thermionic cathodes TC1 and TC2; which thermionic cathodes are connected with lamp terminals LT1 and LT2, respectively.

For sake of clarity, special fluorescent lamp SFL is shown as if it were folded-out flat, thereby to permit seeing the complete path of gas discharge current flow. However, in reality, special fluorescent lamp SFL is "folded-up"; which, more particularly, means that it consists of two interconnected Biax lamps disposed in such manner that each of the four tubular lamp portions is located at a different corner of a square.

FIG. 7 schematically illustrates a modification of the first version of the second initially preferred embodiment; which first version is shown in FIG. 4.

The arrangement of FIG. 7 is identical to that of FIG. 4, except as follows:

Since it no longer needs to house storage battery SB, the housing of special power supply SPS of FIG. 4 has been made far smaller and has been integrated with ordinary power plug OPP', thereby to form an integral combination of special power supply SPS and power plug prongs PPP1/PPP2; which integral combination is now referred to as special power supply SPS'. In other words, ordinary power plug OPP' of FIG. 4 has been made an integral part of the reduced-size power supply housing and is used for supporting this housing when plugged into household electrical receptacle OHER.

That is, the circuitry of special power supply SPS' of FIG. 7 is identical to that of special power supply SPS of FIG. 5, except that it does not include a built-in storage battery (e.g., SB) as does special power supply SPS of FIG. 5. Instead, special power supply SPS' includes an auxilary receptacle means ARM1 having a pair of auxiliary receptacle terminals connected with the B- bus and the A+ bus.

Instead of built-in storage battery SB of the FIG. 4 arrangement, the arrangement of FIG. 7 has a special storage battery SSB mounted externally. Special storage battery SSB has a special receptable means SRM2; which special receptacle means has a pair of receptacle terminals connected with a pair of battery terminals within special storage battery SSB.

Plug-in connection between special power supply SPS' and special storage battery SSB is effectuated by means of a flexible connect cord FCC; which has a plug-means at each end.

Figure 8:
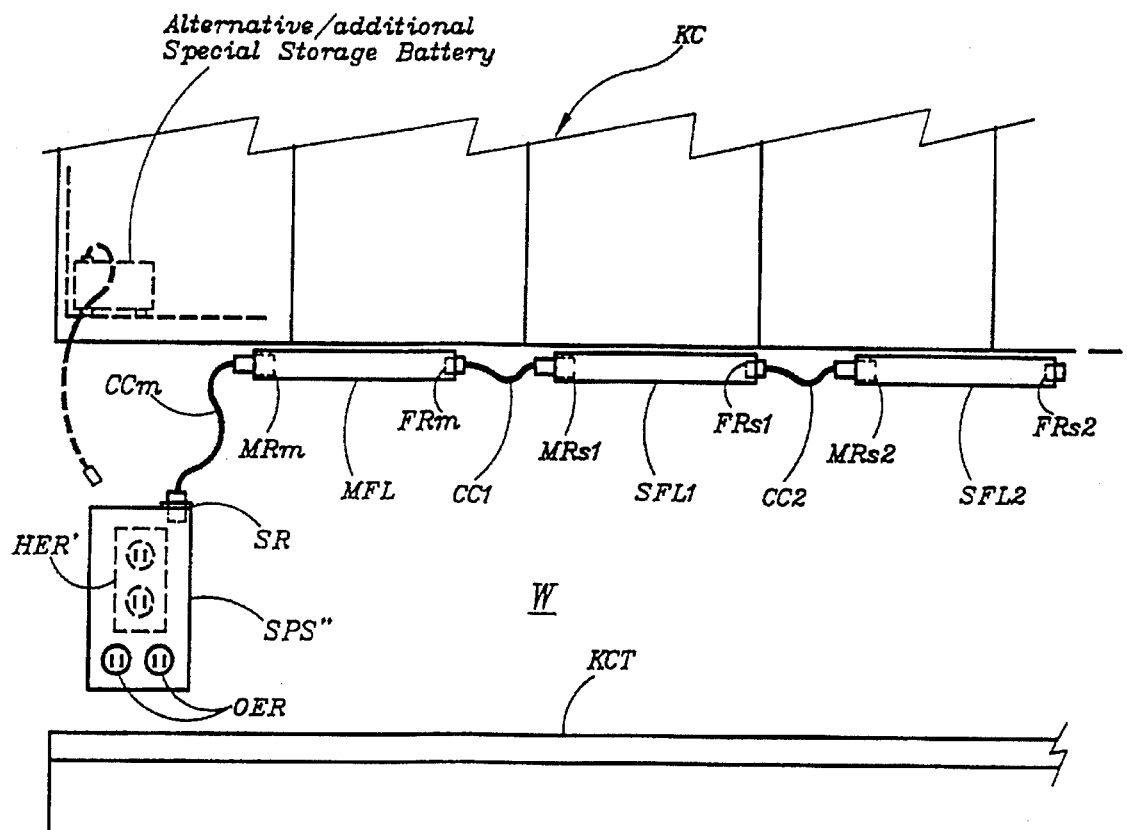
FIG. 8 schematically illustrates a second version of the second initially preferred embodiment.

FIG. 8 schematically illustrates a second version of the second initially preferred embodiment of the invention.

In FIG. 8, a special power supply SPS" is shown mounted on a wall W behind a kitchen counter top KCT and below a number of kitchen cabinets KC.

Special power supply SPS" is shown mounted in such a way as to completely cover ordinary home electrical receptacle HER', which is shown in phantom outline. On the face of special power supply SPS" is located a pair of ordinary electrical receptacles OER; while on top of special power supply SPS" is located a special two-terminal recessed receptacle SR.

Except for the following features, special power supply SPS" is substantially identical to special power supply SPS of the arrangement of FIG. 4:

(i) instead of powering the fluorescent lamp means from an ordinary household-type receptacle (OR in FIG. 4), the fluorescent lamp means of FIG. 8 is powered from SPS" by way of a special recessed receptacle (SR);

(ii) SPS" has a pair of ordinary household-type electric receptacles OER, each of which is electrically connected (by connect means disposed inside of SPS"— not expressly shown) with one of the receptacles of the household electrical receptacle (HER') over which SPS" is mounted and into which SPS" is plugged (by means not expressly shown); and (iii) SPS" includes means (not expressly shown) by which it can be flush-mounted on a wall in such manner as to cover an ordinary wall electrical receptacle, while at the same time having a power plug (not expressly shown) operative to plug into one of the receptacles of this wall electrical receptacle.

A master fluorescent lamp MFL as well as slave fluorescent lamps SFL1 and SFL2 are mounted on a flat surface underneath kitchen cabinets KC. Master fluorescent lamp MFL has a two-terminal recessed male receptacle MRm at its one end and a two-terminal self-shorting female receptacle FRm at its other end. Slave fluorescent lamp SFL1 has a two-terminal recessed male receptable MRs1 at its one end and a two-terminal self-shorting female receptacle FRs1 at its other end; and slave fluorescent lamp SFL2 has a two-terminal recessed male receptacle MRs2 at its one end and a self-shorting female receptacle FRs2 at its other end.

Connection between special receptacle SR and male receptacle MRm is effectuated by connect cord CCm, which has a plug means at each end; connection between female receptacle FRm and male receptacle MRs1 is effectuated by connect cord CC1, which also has a plug means at each end; and connection between female receptacle FRs1 and male receptacle MRs2 is effectuated by connect cord CC2, which likewise has a plug means at each end. Each plug means is commensurate with the receptacle into which it is to be inserted.

Figure 9:
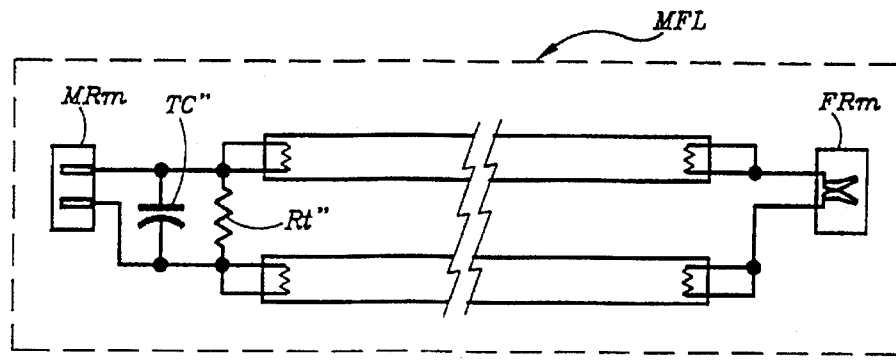
FIG. 9 schematically illustrates the master lamp used in the embodiment of FIG. 8.

FIG. 9 schematically illustrates master fluorescent lamp MFL of FIG. 8.

In FIG. 9, master fluorescent lamp MFL is shown to consist of two separate fluorescent lamps series-connected with each other by way of a normally-shorted switch means integrally combined with a female receptacle means, which switch-receptacle combination is identified by the symbol FRm. Each of the two non-shorted ends of the two separate fluorescent lamps is connected with one of the prongs in the two-prong recessed male receptacle means MRm. Connected between the two non-shorted ends are a tank capacitor TC" and a resistor Rt".

Figure 10:
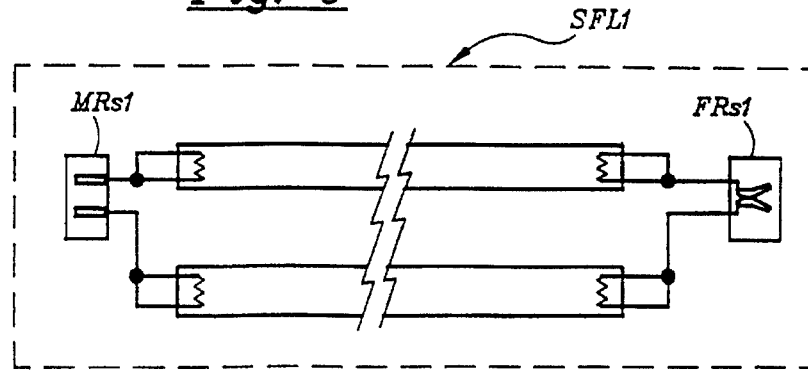
FIG. 10 illustrates one of the slave lamps used in the embodiment of FIG. 8.

FIG. 10 schematically illustrates slave fluorescent lamp SFL1 of FIG. 8.

In FIG. 10, slave fluorescent lamp SFL1 (which is identical to slave fluorescent lamp SFL2) is shown to consist of two separate fluorescent lamps series-connected with each other by way of a normally-shorted switch means integrally combined with a female receptacle means, which switch-receptacle combination is identified by the symbol FRs1. Each of the two non-shorted ends of the two separate fluorescent lamps is connected with one of the prongs in the two-prong recessed male receptacle means MRs1.

Re Operation of Second Initially Preferred Embodiment

With reference to FIGS. 5 and 6, the operation of the first version of the second initially preferred embodiment of FIG. 4 may be explained as follows.

As long as ordinary 120 Volt/60 Hz power line voltage is indeed provided at receptacle OHER, a DC supply voltage of magnitude in excess of about 140 Volt will be present between the B– bus and the B+ bus in special power supply SPS (see the circuit arrangement of FIG. 5). With the DC supply voltage having a magnitude in excess of 140 Volt, the pre-converter IC (PCIC) will not be activated; which means that no power will be consumed by the pre-converter circuitry, which mainly consists of elements FET, PCIC, ESI and D2.

Thus, as long as power line voltage is indeed provided at receptacle OHER, the half-bridge series-resonant inverter ballast (which mainly consists of elements Qa, Qb, CTa, CTb, Ca, Cb, TI and TC', where TC' is part of screw-in compact fluorescent lamp SCFL) is powered from the power line voltage; which is to say that, when ON-OFF switch OOS is in its ON position and power line voltage is indeed present at receptacle OHER, compact screw-in fluorescent lamp CSFL is powered from the power line voltage. Moreover, as long as power line voltage is provided, storage battery SB will be charged at a relatively low rate by way of resistor Rbc.

However, in case of power failure, the magnitude of the DC supply voltage will fall below 140 Volt; and, as soon as this magnitude falls below 140 Volt by some relatively small amount (e.g., by 20 Volt), pre-converter PCIC will be activated; which, in turn, will cause the magnitude of the DC supply voltage to be maintained at some lower predetermined level (e.g., 130 Volt), but only as long as the magnitude of the voltage present between the B– bus and the A+ bus remains above a certain minimum level (e.g., 10 Volt). Thus, as long as the magnitude of the voltage supplied by storage battery SB remains higher than this certain minimum level (10 Volt), the magnitude of the inverter's DC supply voltage (i.e., the voltage provided between the B– bus and the B+) bus will be maintained at the lower predetermined level (130 Volt); which therefore will cause lamp CSFL to continue to provide luminous output even if the power line voltage were to be removed from receptacle OHER.

In light of the functional description provided hereinabove, combined with well known prior art and the description herein of the First Initially Preferred Embodiment, a person possessing ordinary skill in the particular art pertinent hereto will readily understand the details of the operation of special power supply SPS of FIG. 5 and compact screw-in fluorescent lamp CSFL of FIG. 6.

The arrangement of FIG. 7 is substantially equivalent to that of FIG. 4, except for having made the storage battery an external element (connectable with the special power supply (SPS') by way of a simple flexible connect cord FCC), thereby readily permitting storage battery SSB (in case it were to have become discharged) to be substituted with another storage battery or even with a primary battery. Clearly, the arrangement of FIG. 7 has utility when supplied/ used without a battery, but has the added value of permitting at any time the addition of a battery.

Thus, for reasons of economy, a person may initially purchase nothing more than the plug-mounted power supply (SPS') and the screw-in compact fluorescent lamp (SCFL), and then—at some later date—purchase either a large or small special storage battery (e.g., SSB), and/or a large or small primary battery, combined with a flexible connect cord (FCC) suitable for connection between auxiliary receptable means ARM1 and whatever connect means (e.g., SRM2) be provided by or in connection with the storage and/or primary battery.

With reference to FIGS. 9 and 10, the operation of the second version of the second initially preferred embodiment, which is illustrated by FIG. 8, is explained as follows.

The operation of special power supply SPS" is substantially identical to that of the first version of the presently preferred embodiment; and the operation of master fluorescent lamp MFL is substantially identical to that of screw-in compact fluorescent lamp SCFL of FIG. 6. As one (or more) slave fluorescent lamp(s) is plugged into receptacle FRm of lamp MFL, the operation of the resulting series-combination of lamps remains substantially identical to that of lamp SCFL of FIG. 6.

The maximum number of lamps that may be series-connected this way depends on: (i) the magnitude of the ignition voltage of each individual lamp; (ii) the total number of individual lamps; and (iii) the magnitude of the ignition voltage provided from output receptacle SR of special power supply SPS".

Additional Comments re Second Initially Preferred Embodiment (a) It is emphasized that for OEM applications the arrangement of FIG. 4 should be modified such that special power supply SPS be comprised within the body of ordinary table lamp OTL. The result would then be a table lamp: (i) having an integral special power supply with built-in energy-storage means; (ii) being adapted to be plugged directly into an ordinary household electrical receptacle; and (iii) being functional such as to continue to provide light even in the event of a power failure.

(b) With respect to the arrangement of FIG. 8, each of connect cords CC1/CC2 is so constituted as to have: (i) at its one end, a female plug operative to plug into one of the recessed male receptacles MRs1/MRs2; and (ii) at its other end, a male plug operative to plug into one of female receptacle means FRm/FRs1/FRs2.

With reference to FIG. 10, the male plug intended to be plugged into exemplary female receptacle FRs1 has two terminals and is constituted such that, upon insertion into receptacle FRs1, it forces the two normally-connected terminals of FRs1 apart while at the same time causing each of its two terminals to make electrical connection with one of the two terminals of receptacle FRs1.

(c) It is emphasized that the screw-in compact fluorescent lamp of FIG. 3 has a screw-base within which is mounted several electronic components (i.e., ballast assembly BA); which is to say, the screw-base is used as a housing for at least a part of the circuitry required for ballasting the fluorescent lamp, thereby permitting the rest of the complete lamp assembly to be more compact.

Similarly, the screw-in compact fluorescent lamp of FIG. 6 has some of its electronic components comprised within the screw-base.

(d) In situations where it be necessary to provide electrical isolation between the power line and the terminals connected with the storage battery—such as with the arrangement of FIG. 7—battery charging is accomplished by way of an isolated auxiliary winding on tank inductor TI; the output from which auxiliary winding is full-wave-rectified and supplied to output receptacle ARM1 by way of a smoothing inductor.

(e) For some applications, it is advantageous to provide special power supply SPS" of FIG. 8 in the form of a cord-connected stand-alone power supply, such as special power supply SPS of FIG. 4.

(f) In the various screw-in compact fluorescent lamp assemblies (e.g., the one illustrated by FIG. 3), it is important to arrange for the fluorescent lamp itself (e.g., UL in FIG. 3) to require an ignition voltage of magnitude substantially higher than that of the power line voltage usually provided in an ordinary Edison-type lamp socket. That way, if one of these screw-in compact fluorescent lamps were to be screwed into an ordinary live lamp socket, it would not ignite and no detrimental results would occur.

(g) Similarly, it is important that no damage result in case some load with an ordinary electric power plug were to be plugged into ordinary output receptacle OR of FIG. 4.

As long as special power supply SPS includes circuitry like that of FIG. 5, no damage is likely to result.

In fact, even if a short circuit were to be applied to receptacle OR, only a modest amount of high-frequency current would be flowing through this short circuit.

More particularly, any resistive load connected with receptacle OR would be subjected to a high-frequency squarewave voltage of RMS magnitude equal to about 80 Volt modified by the fact that this squarewave voltage is fed to the receptacle terminals though tank inductor TI; which will cause any resulting current to be manifestly limited in magnitude.

(h) In the arrangement of FIG. 7, different sizes of special storage batteries SSB may be used. The particular size (or amp-hr capacity) preferable in a given application would depend on the details of the particular circumstances associated with that given application.

Also, it is important to realize that a primary battery (e.g., two series-connected 6 Volt lantern batteries) may be used instead of the indicated storage battery.

(i) The power required to power one of the screw-in compact fluorescent lamps (e.g., SCFL) may expectedly be anywhere from about 5 Watt to about 25 Watt. For many typical applications, a power level associated with full light output from the screw-in compact fluorescent lamp will be about 12 Watt. Similar power levels pertain with respect to the master and/or slave fluorescent lamps associated with the arrangement of FIG. 8.

In other words, with reference to the arrangements of FIGS. 4, 7 and 8, a 12 Volt storage battery of 1 Amp-Hour capacity would be able to power a 12 Watt fluorescent lamp for nearly one hour at full light output; which implies that it would provide half-of-full light output for more than two hours.

(j) In some circumstances, the external battery arrangement of FIG. 7 may advantageously be applied to the under-the-cabinet lighting system of FIG. 8, in which case the special external storage (or primary) battery would preferably be located within one of the indicated cabinets—with connect cord CCm being connected between the external storage battery (e.g., SSB of FIG.

7) and the special power supply (e.g., SPS' of FIG. 7) by way of a small opening drilled in the floor of the cabinet.

(k) It is noted that resistor Ra2 of FIG. 5 is indicated as being adjustable.

By adjusting the magnitude of the resistance of Ra2, the magnitude of the DC supply voltage developed at the B+ bus (as referenced to the B− bus) will be adjusted correspondingly in the sense that: the higher the resistance of Ra2, the lower the magnitude of the DC supply voltage developing at the B+ bus.

Thus, in case of power failure, the magnitude of the light provided by whatever lamp be powered from the inverter power supply of FIG. 5 will be adjusted by adjusting the magnitude of the resistance of adjustable resistor Ra2.

DESCRIPTION OF THE THIRD INITIALLY PREFERRED EMBODIMENT

Re Construction of the Third Initially Preferred Embodiment

Figure 11:
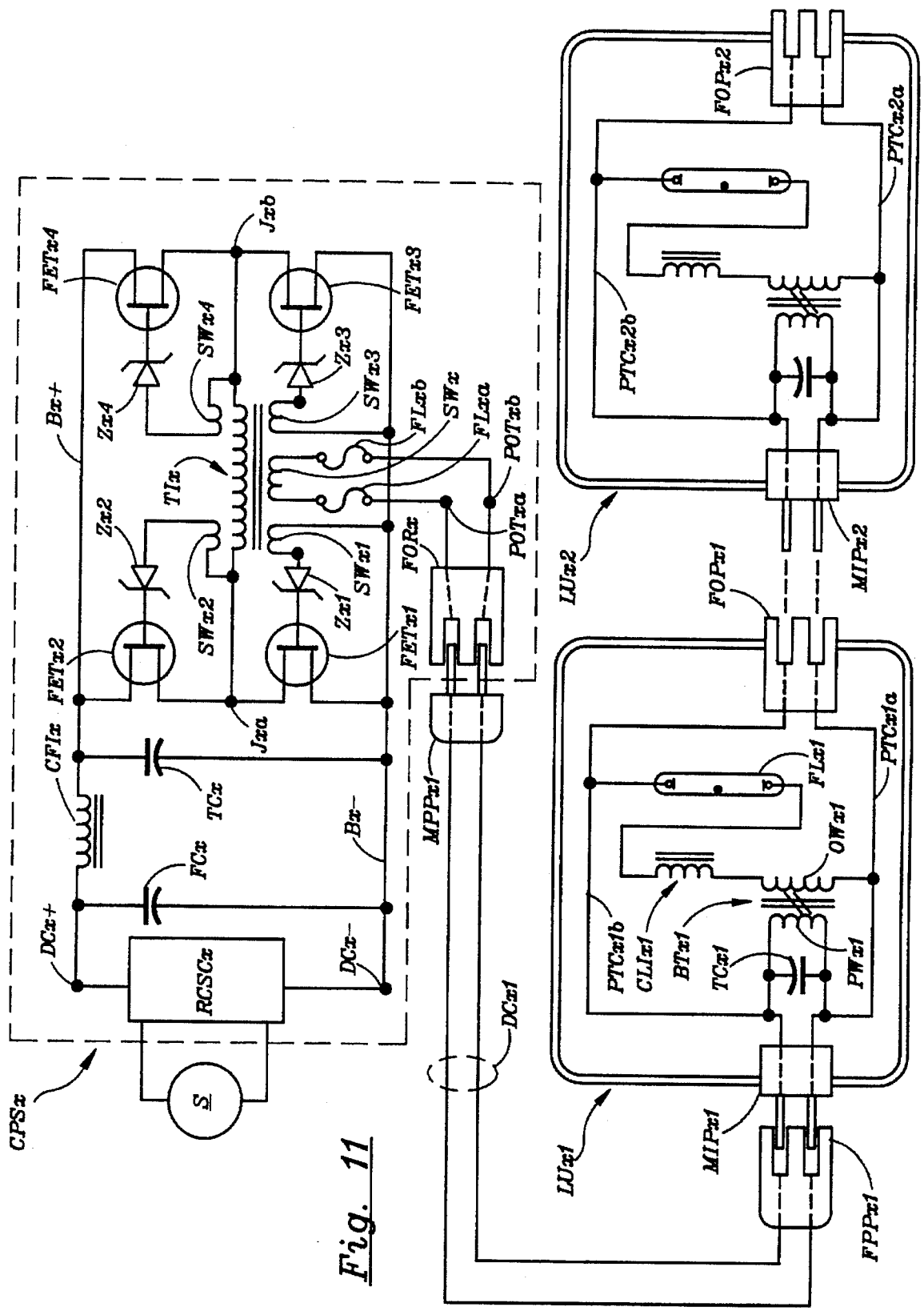
FIG. 11 schematically illustrates a first implementaion of a third initially preferred embodiment of the invention.

FIG. 11 schematically illustrates a first implementation of the third initially preferred embodiment of the invention.

In FIG. 11 a constant-magnitude DC supply voltage, which is derived from a power line source S by way of a rectification and conditioning sub-circuit RCSCx, is provided between DC terminals DCx− and DCx+; between which DC terminals a filter capacitor FCx is connected. The DCx− terminal is connected directly with a Bx− bus; and the DCx+ terminals is connected with a Bx+ bus by way of a current-feed inductor CFIx. A tank-capacitor TCx is connected between the Bx− bus and the Bx+ bus.

A first field effect transistor FETx1 is connected with its source to the Bx− bus and its drain to a junction Jxa to which is connected the source of a second field effect transistor FETx2, whose drain is connected with the Bx+ bus.

Likewise, a third field effect transistor FETx3 is connected with its source to the Bx− bus and its drain to a junction Jxb to which is connected the source of a fourth field effect transistor FETx4, whose drain is connected with the Bx+ bus.

A tank inductor TIx is connected between junctions Jxa and Jxb; which tank inductor TIx has a main secondary winding SWx tightly coupled to tank inductor TIx. A first auxiliary secondary winding SWx1 is connected between the source and the gate of transistor FETx1 by way of a Zener diode Zx1; a second auxiliary secondary winding SWx2 is connected between the source and the gate of transistor FETx2 by way of a Zener diode Zx2; a third auxiliary secondary winding SWx3 is connected between the source and the gate of transistor FETx3 by way of a Zener diode Zx3; and a fourth auxiliary secondary winding SWx4 is connected between the source and the gate of transistor FETx4 by way of a Zener diode Zx4.

Main secondary winding SWx is connected a boss power output terminals POTxa and POTxb of a female-type output receptacle FORx by way of fusible links FLxa and FLxb.

A male-type power plug MPPx1 is plugged into output receptacle FORx; which power plug MPPx1 connects with one end of a pair of distribution conductors DCx1; which, at the other end, connect with a female-type power plug FPPx1.

A first lighting unit LUx1 has a male-type input port MIPx1, into which is plugged female-type power plug FPPx1. Input port MIPx1 has two terminals which are connected with a two-terminal female-type output port FOPx1 by way of a first and a second pass-through-conductor PTCx1a and TCx1b.

Between pass-through-conductors PTCx1a and PTCx1b are connected a tank-capacitor TCx1 and a primary winding PWx1 of a ballasting transformer BTx1; which ballasting transformer BTx1 has an output winding OWx1 with two terminals, one of which is connected with pass-through-conductor PTCx1a, the other of which is connected with one terminal of a fluorescent lamp FLx1 by way of a current-limiting inductor CLIx1. The other terminal of fluorescent lamp FLx1 is connected with pass-through-conductor PTCx1b. Preferably, current-limiting inductor CLIx1 is an integral part of ballasting transformer BTx1; which is to say, current-limiting inductor CLIx1 actually represents the leakage inductance of output winding OWx1.

A second lighting unit LUx2, which is substantially identical to first lighting unit LUx1, has a male-type input port MIPx2 plug-in-connected with female-type output port FOTx1 of lighting unit LUx1; which input port MIPx2 has two terminals connected with a two-terminal female-type output port FOPx2 by way of pass-through-conductors PTCx2a and PTCx2b.

A third lighting unit can be plugged into output port FOPx2; etc.

The complete assembly between power line source S and male-type power plug MPPx1 is referred-to as central power supply CPSx.

Figure 12:
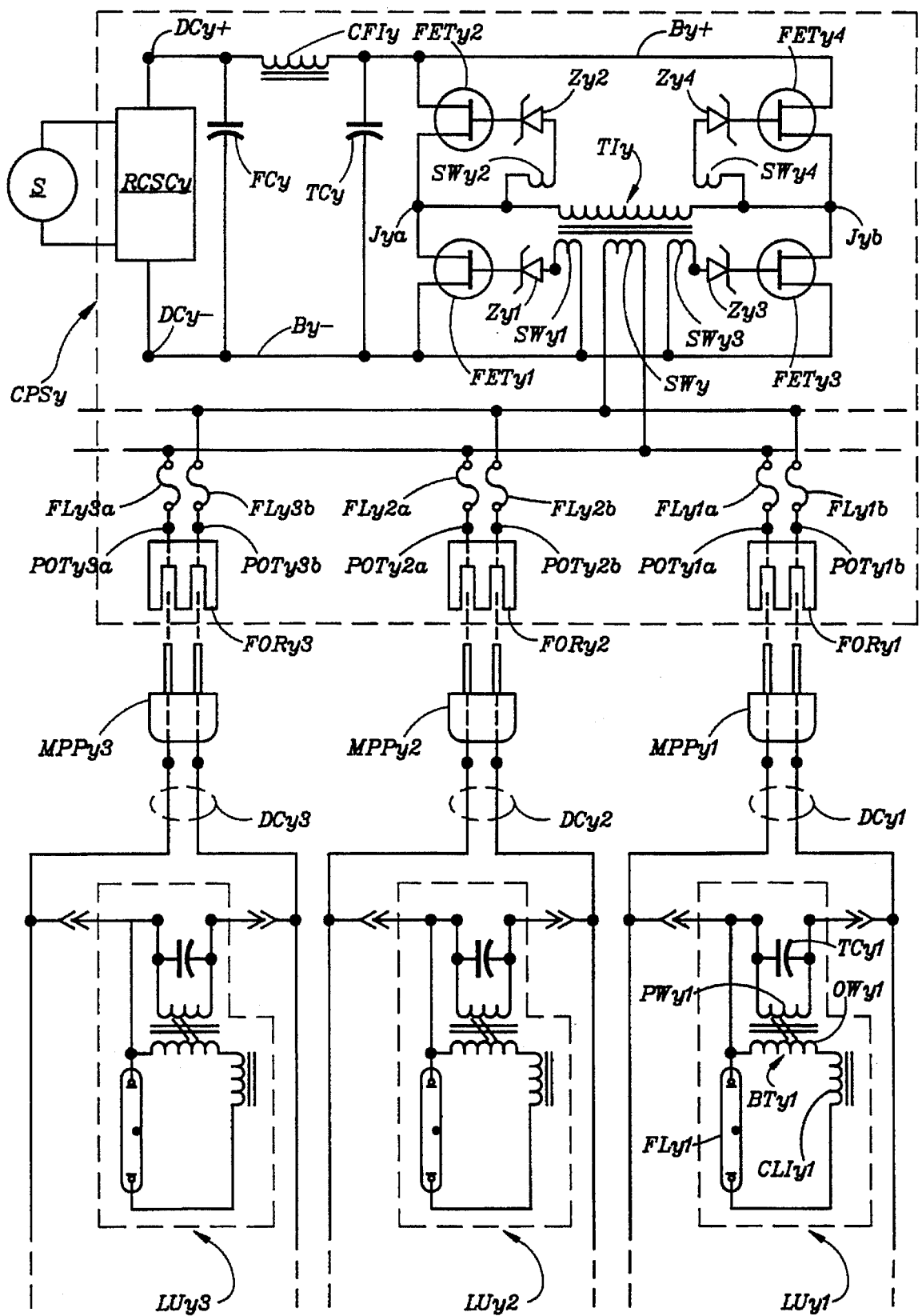
FIG. 12 schematically illustrates a second implementation of the third initially preferred embodiment of the invention.

FIG. 12 schematically illustrates a second implementaion of the third initially preferred embodiment of the invention.

The arrangement of FIG. 12 has a central power supply CPSy; which is basically the same as central power supply CPSx of FIG. 11, except that: (i) individual component parts are now labeled with the sub-script "y" instead of "x"; and (ii) the output from the secondary winding of tank inductor TIy is applied to plural pairs of power output terminals, now labeled POTy1a/POTy1b, POTy2a/POTy2b, POTy3a/POTy3b, etc. of plural female-type output receptacles FORy1, FORy2, FORy3, etc. by way of plural pairs of fusible links FLy1a/FLy1b, FLy2a/FLy2b, FLy3a/FLy3b, etc.

Connected with output receptacle FORy1 is a male-type power plug MPPy1 from which extends a pair of distribution conductors DCy1 between which is disconnectably connected at least one lighting unit LUy1. Lighting unit LUy1 is basically similar to lighting unit LUx1, and includes the same constituent parts, except now labeled with subscript "y" instead of "x". Thus, lighting unit LUy1 includes: TCy1; ballasting transformer BTy1 with primary winding PWy1 and output winding OWy1; current-limiting inductor CLIy1; and fluorescent lamp FLy1.

Connected with output receptacle FORy2 is a male-type power plug MPPy2 from which extends a pair of distribution conductors DCy2 between which is disconnectably connected at least one lighting unit LUy2; which lighting unit LUy2 is identical or similar to lighting unit LUy1.

Connected with output receptacle FORy3 is a male-type power plug MPPy3 from which extends a pair of distribution conductors DCy3 between which is disconnectably connected at least one lighting unit LUy3; which lighting unit LUy3 is identical or similar to lighting unit LUy1.

Re Operation of the Third Initially Preferred Embodiment

The operation of the circuit arrangement of FIG. 11 may be described as follows.

Power line source S provides an ordinary 120 Volt/60 Hz power line voltage to rectification and conditioning sub-circuit RCSC; which sub-circuit is functional to draw from the power line source a nearly sinusoidal current and to provide a constant-magnitude DC supply voltage across filter capacitor FCx and thereby across DC terminals DCx– and DCx+. This constant-magnitude DC supply voltage is supplied via current-feed inductor CFIx to the pair of DC bus conductors labeled Bx– and Bx+; from which is supplied unidirectional current to the self-oscillating bridge inverter represented by field effect transistors FETx1, FETx2, FETx3 and FETx4; which transistors are controlled such as to switch ON and OFF alternatingly and periodically at a rate of about 35 Khz and in such manner that: (i) transistors FETx1/FETx4 are always in the same state with respect to each other (e.g., ON); and (ii) transistors FETx2/FETx3 are always in the same state with respect to each other, but in a state opposite that of transistors FETx1/FETx4 (e.g., OFF).

The output of the bridge inverter, which derives from junctions Jxa and Jxb, is applied to tank-inductor RIx; which tank-inductor, by virtue of being commutated every half-cycle of the 35 kHz inverter output voltage, is effectively parallel-connected across tank-capacitor TCx, thereby to provide for the sought-after parallel-resonant action.

{An additional and separate tank-capacitor may be connected directly in parallel with tank-inductor TIx; and, as a result, the inverter output voltage would attain a more nearly ideal sinusoidal waveform. However, this additional tank-capacitor is not necessary in most practical situations.}

The magnitude of the inductance of current-feed-inductor CFIx is not critical, as long as it is large enough to prevent the magnitude of the current flowing into the bridge inverter from changing to any substantive degree during a half-cycle of the 35 kHz inverter output voltage. That being the case, the particular inductance value of current-feed-inductor CFIx does has no bearing on the frequency or the waveform of the inverter output voltage.

The inverter is made to self-oscillate by virtue of positive feedback provided by the four feedback secondary windings labeled SWx1, SWx2, SWx3, SWx4; each of which feedback windings provides a substantially sinusoidal 35 kHz voltage across its output terminals; which sinusoidal output voltage is applied, by way of a Xener diode, between the gate and the source of an associated field effect transistor. For each pair of gate/source terminals, the purpose of the associated Zener diode is that of modifying the sinusoidal waveshape of the feedback voltage provided by the feedback winding such that it results in a more advantageous transistor switching voltage, yet without exceeding the maximum permissible magnitude for the drive voltage resulting between the gate/source terminals. Typically, the Zener voltage of each Zener diode will be about 4.2 Volt; while the peak magnitude of the 35 kHz voltage provided from each feedback winding will be 30 Volt.

In the circuit arrangement of FIG. 11, the inverter has to be triggered into self-oscillation; which triggereing may be accomplished manually or in a variety of well known ways.

Figure 13:
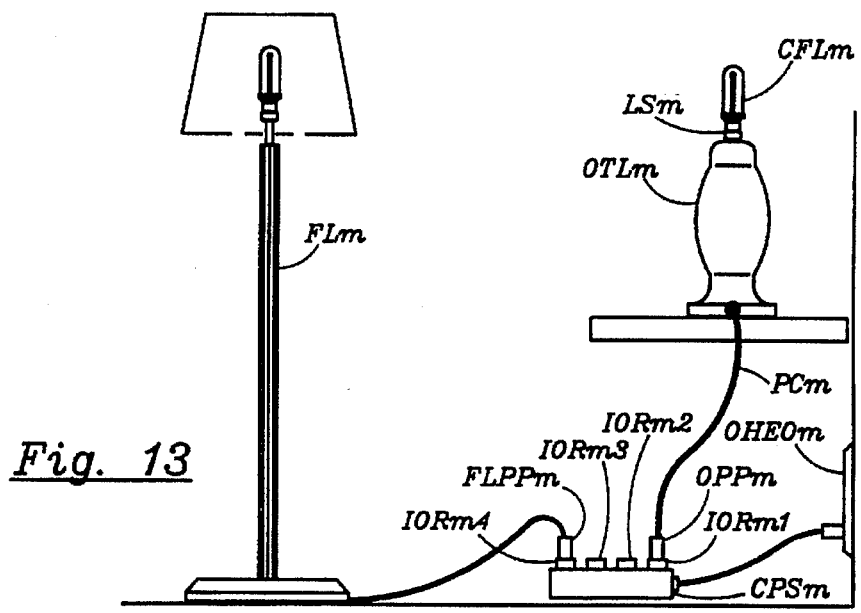
FIG. 13 schematically illustrates the first anticipated application of the third initially preferred embodiment of the invention.

For additional explanations regarding the operation of a current-fed parallel-resonant FET bridge inverter such as that of FIG. 11, reference is made to the explanation provided in connection with FIG. 13 of co-pending patent application Ser. No. 08/326,197.

Tank-inductor TIx is represented by a winding on a gapped ferrite core; which winding, in addition to constituting tank-inductor TIx, is also the primary winding of a transformer whose main secondary winding is SWx; which secondary winding SWx is tightly coupled with the preimary winding TIx. Thus the 35 kHz inverter output voltage with the nearly sinusoidal waveform that is generated across tank-inductor TIx results in a 35 kHz voltage of the same waveform being present across the output terminals of secondary winding SWx. Similarly, a 35 kHz voltage with the same waveform is also provided at the output terminals of each of secondary windings SWx1, SWx2, SWx3, SWx4.

The RMS magnitude of the 35 kHz voltage provided at the output of secondary wibding SWx is chosen to be the maximum permissible to meet the shock hazard safety requirements associated with so-called Class-2 circuits. According to the National Electrical Code, this maximum magnitude is 30 Volt for voltage of 60 Hz. Due to substantial so-called skin effect, for a 35 kHz voltage the potential for shock hazard is far reduced compared with that of a 60 Hz voltage; and it is estimated that at 35 kHz a voltage of RMS magnitude of 75 Volt represents a shock hazard no higher than that of a 60 Hz/30 Volt voltage. Hence, the magnitude of the 35 kHz output voltage provided across secondary winding SWx is chosen to be about 75 Volt RMS.

The output voltage from secondary winding SWx is provided to power output terminals POTxa/POTxb of female output receptacle FORx by way of a pair of fusible links FLxa/FLxb.

The purpose of these fusible links is that of limiting the RMS magnitude of the maximum current that can be drawn from output receptacle FORx in such manner as to comply with the requirements of Class-2 and/or Class-3 electrical circuits in accordance with the National Electrical Code, thereby to provide protection against fire-initiation-hazard.

Thus, with the output from receptacle FORx being limited so as to protect against both shock-hazard and fire-initiation-hazard in effective accordance with the requirements of the Class-2 specifications of the National Electrical Code, little additional shock/fire protection consideration has to be applied to whatever load(s) be connected with output receptacle FORx. For instance, this means that the conductors distributing power from receptacle FORx (e.g., DCx1) may be treated as telephone or bell wires; which, inter alia, means that the distribution conductors can be safely installed by an unskilled person without fear of shock hazard and without fear of creating a fire-initiation hazard.

Lighting unit $Lu_{x1}$ of FIG. 11 includes a ballasting transformer BTx1 whose primary winding PWx1 is (by way of male power plug MPPx1, distribution conductors DCx1, female power plug FPPx1, and male-type input port MIPx1) connected with the 75 Volt/35 kHz sinusoidal output voltage provided from female output receptaclle FORx of central power supply CPSx. Ballasting transformer BTx1 has an output winding OWx1 that is coupled relatively loosely with primary winding PWx1; which is to say, there is a substantial degree of magnetic leakage between primary winding PWx1 and output winding OWx1; which therefore makes ballasting transformer BTx1 a so-called leakage transformer.

Output winding OWx1 is series-connected with primary winding PWx1 in such a way that the voltage across the primary winding adds to the voltage across the output winding, thereby making ballasting transformer BTx1 a so-called auto-transformer.

With fluorescent lamp FLx1 connected and powered, primary winding PWx1 represents an inductor whose inductance is composed of the primary winding's own leakage inductance parallel-connected with the net total inductance reflected from the loading on output winding OWx1. Thus, when lighting unit LUx1 is connected with the power output terminals POTxa/POTxb of central power supply CPSx, tank-capacitor TCx1 and the inductor represented by primary winding PWx1 are both directly parallel-connected across secondary winding SWx of tank-inductor TIx of central power supply CPSx, and may therefore cause the natural resonance frequency of the total net LC tank-circuit effectively connected with the inverter's output terminals Jxa/Jxb to change; which, in turn, would cause the inverter frequency to change. However, by making the natural resonance frequency of tank-capacitor TCx1, as parallel-resonating with the inductor represented by primary winding PWx1, equal to the frequency of the 35 kHz output voltage provided at output receptacle FORx before being connected with a load, no change in the natural resonance frequency will occur.

Thus, by making the natural parallel-resonance frequency represented by the each of the lighting units (LUx1, LUx2, etc.) connected with the output terminals of central power supply CPSx equal to the frequency of the output voltage provided therefrom (when no load is connected therewith), any number of such lighting units can be connected without affecting the frequency of this output voltage.

Preferably, a just-sufficient amount of leakage inductance is provided for by ballasting transformer BTx1 so as not to require current-limiting inductor CLIx1; which means that inductor CLIx1 would normally not be required.

As shown, lighting unit LUx2 may be plugged directly (or by way of a light-weight cord with male and female power plug means) into the down-stream end of lighting unit LUx1. Yet another lighting unit (e.g. LUx3) may similarly be plugged into the down-stream end of lighting unit LUx2. However, each of these lighting units may just as well be connected directly across a pair of disribution conductors.

FIG. 12 schematically illustrates a central power supply CPSy with plural female-type output receptacles FORy1, FORy2, FORy3, etc.; each of which output receptacles is connected with the output terminals of the central power supply's inverter by way of a pair of fusible links. Thus, plural lamp loads may be parallel-connected directly with central power supply CPSy.

By making the total power-generating capability of central power supply CPSy sufficiently high, each individual power output receptacle may supply the maximum Volt-Ampere Product allowed under the Class-2 rating; which maximum Volt-Ampere Product is 100 VA; which, if loaded with loads having high power factors, will allow for nearly 100 Watt to be drawn from each individual output receptacle.

Lighting unit LUy1 may be of a type drawing (from associated output receptacle FORy1 on central power supply CPSy) the maximum allowable Volt-Ampere Product. If so, no additional lighting units may be usefully connected to this output receptacle. Otherwise, however, any number of lighting units may be connected thereto, as long as the total Volt-Ampere Product drawn from this output receptacle does not exceed 100 VA.

APPLICATIONS OF THE THIRD INITIALLY PREFERRED EMBODIMENT

FIG. 13 illustrates a first anticipated application of the circuit arrangements of FIG. 11 and/or FIG. 12.

In FIG. 13, a central power supply CPSm, which is plugged into an ordinary household electrical outlet OHEOm, has four individual output receptacles IORm1/IORm2/IORm3/IORm4, each operative to receive and hold an ordinary power plug OPPm such as usually found at the end of a power cord PCm of an ordinary table lamp OTLm into whose lamp socket LSm is screwed a compact fluorescent lamp CFLm having a ballasting arrangement, like that of lighting unit LUx1 of FIG. 11, built into its base. Thus, in effect, compact screw-in fluorescent lamp CFLm of FIG. 13 corresponds to lighting unit LUx1 of FIG. 11; except that CFLm does not have anything corresponding to output receptacle FORx1.

While power plug OPPm of table lamp OTLm is plugged into output receptacle IOMm1, a power plug FLPPm of a floor lamp FLm is plugged into output receptacle IOMm4 of central power supply CPSm. A compact screw-in fluorescent lamp simlilar to CFLm is screwed into and held by the lamp socket of the floor lamp.

Figure 14:
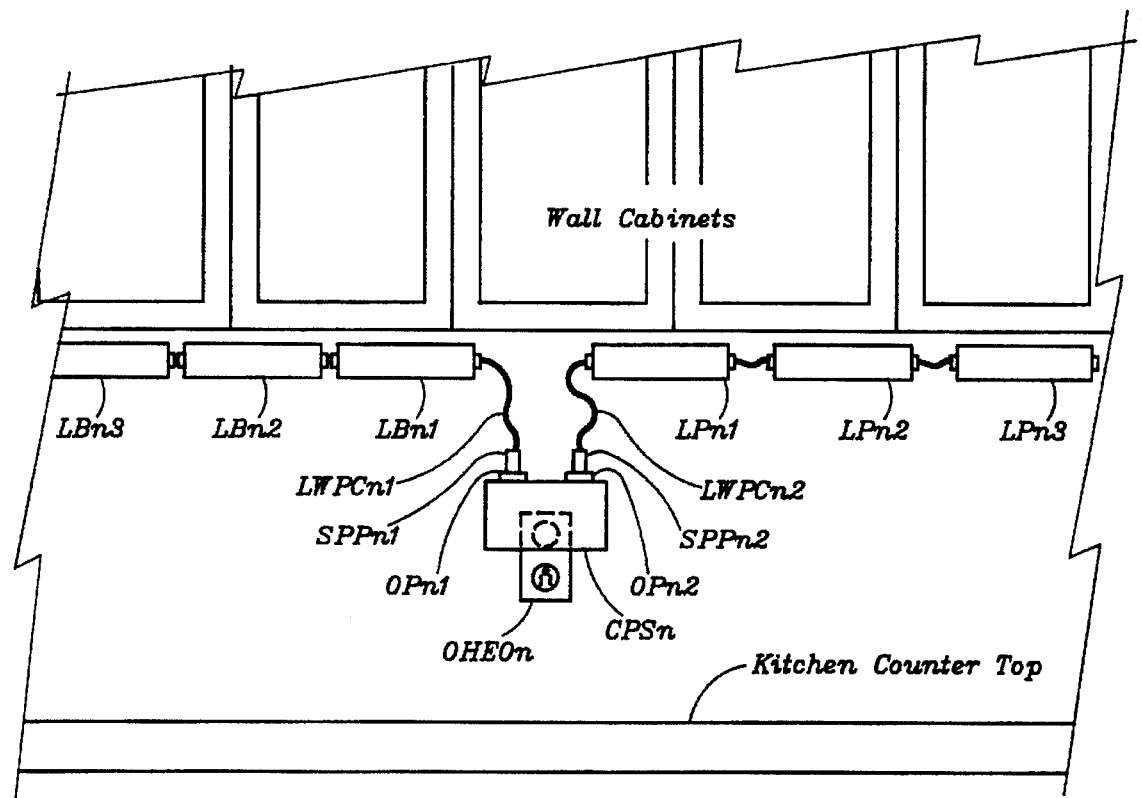
FIG. 14 schematically illustrates the second anticipated application of the third initially preferred embodiment of the invention.

FIG. 14 illustrates a second anticipated application of the circuit arrangements of FIG. 11 and/or FIG. 12.

In FIG. 14, a central power supply CPSn integrally includes its own pair of power prongs, which are directly into and supported by an ordinary household electrical outlet OHEOn. Central power supply CPSn has two output ports OPn1 and OPn2. Into output port OPn1 in plugged a special small male-type power plug SPPn1 which, via a light-weight power cord LWPCn1, connects with a first one of several under-the-cabinet light-bars LBn1, LBn2, LBn3, etc., each of which corresponds to lighting unit LUx1 of FIG. 11.

Likewise, into output port OPn2 is plugged a special small male-type power plug SPPn2 which, via a light-weight power cord LWPCn2, connects with a first one of several under-the-cabinet light-panels LPn1, LPn2, LPn3, etc., each of which corresponds to lighting unit LUx1 of FIG. 11.

Figure 15:
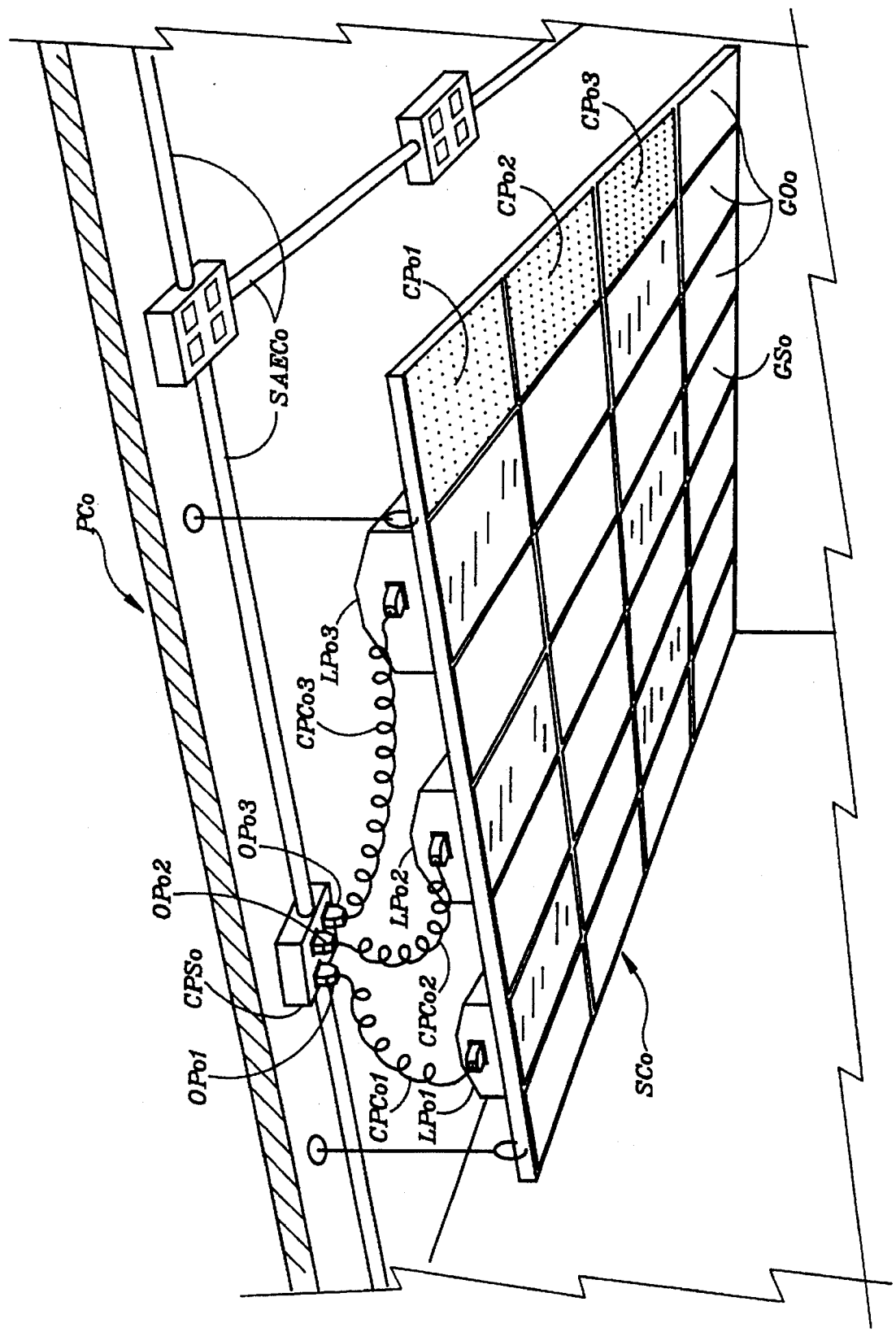
FIG. 15 schematically illustrates the third anticipated application of the third initially preferred embodiment of the invention.

FIG. 15 illustrates a third anticipated application of the circuit arrangements of FIG. 11 and/or FIG. 12.

In FIG. 15, one of plural central power supplies CPSo is hard-wired to the AC power line by way of a steel-armored electrical conduit SAECo and is mounted onto a permanent ceiling PCo above a suspended ceiling SCo having a grid structure GSo with numerous grid openings GOo into some of which grid openings are placed light panels LPo1, LPo2, LPo3, etc., and into most of which grid opening are placed ceiling panels CPo1, CPo2, CPo3, etc.

Light panels LPo1/LPo2/LPo3/etc. are plug-in connected by way of coiled light-weight power cords CPCo1/CPCo2/COCo3/etc. with output ports OPo1/OPo2/OPo3/etc. of central power supply CPSo, all respectively.

Central power supply CPSo is equivalent to central power supply CPSy of FIG. 12; and output ports OPo1/OPo2/OPo3 are equivalent to output ports FORy1/FORy2/FORy3 of FIG. 12.

Each one of light panels LPo1/LPo2/LPo3 is equivalent to lighting unit LUy1 of FIG. 12.

Figure 16:
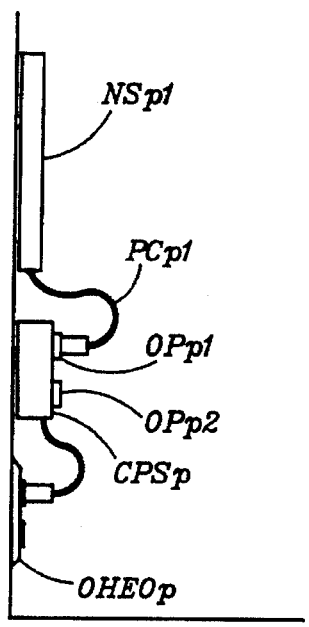
FIG. 16 schematically illustrates the fourth anticipated application of the third initially preferred embodiment of the invention.

FIG. 16 illustrates a fourth anticipated application of the circuit arrangements of FIG. 11 and/or FIG. 12.

In FIG. 16, central power supply CPSp is mounted on a wall and is plugged into an ordinary household electrical outlet OHEOp. Central power supply CPSp has plural 35 kHz Class-2 power output ports OPp1/OPp2/etc. One of plural neon signs NSp1 has a light-weight flexible power cord PCp1 plug-in-connected with output port OPp1 of central power sypply CPSo.

Central power supply CPSo is equivalent to central power supply CPSy of FIG. 12.

Neon sign NSo1 corresponds to lighting unit LUy1 of FIG. 12 with a neon lamp substituted for fluorescent lamp FLy1.

Figure 17:
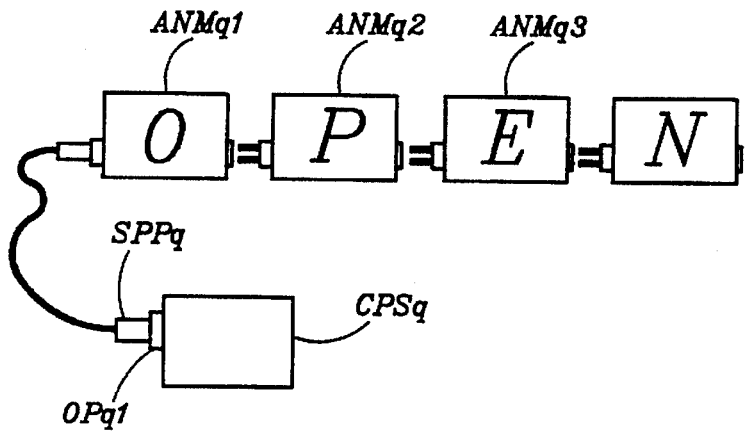
FIG. 17 schematically illustrates the fifth anticipated application of the third initially preferred embodiment of the invention.

FIG. 17 illustrates a fifth anticipated application of the circuit arrangements of FIG. 11 and/or FIG. 12.

In FIG. 17, central power supply CPSq, which is powered from an ordinary electric utility power line, has a 35 kHz Class-2 power output port OPql into which is plugged a special power plug SPPq connected with the first one of plural neon-lamp-type alpha-numeric modules ANMq1/ANMq2/ANMq3/etc.; which alpha-numeric modules are plug-in-connected with one another in a manner analogous to the way lighting units LUx1/LUx2/LUx3/etc. of FIG. 11 are connected together.

Central power supply CPSq is equivalent to central power supply CPSx of FIG. 11.

Figure 18:
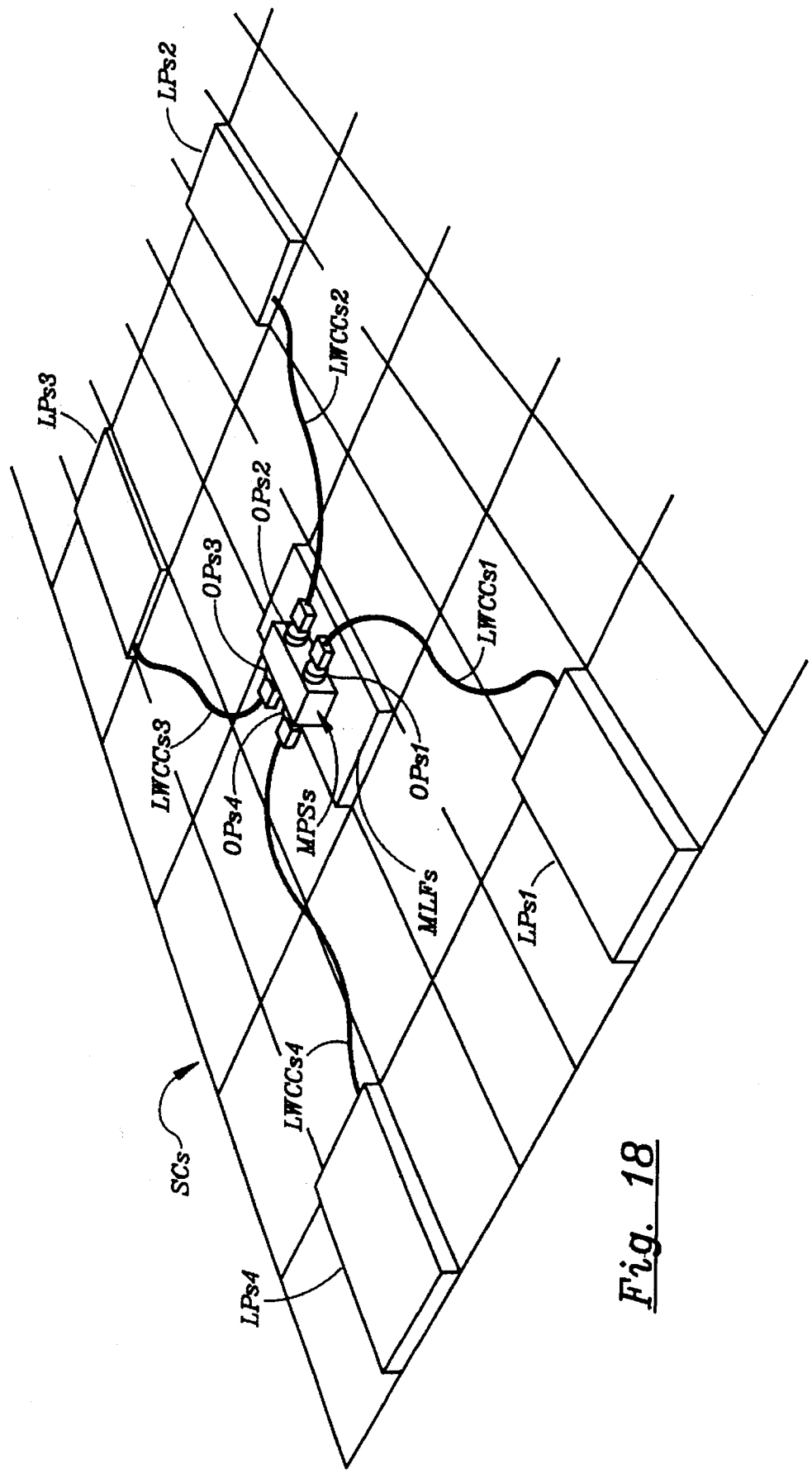
FIG. 18 schematically illustrates the sixth anticipated application of the third initially preferred embodiment of the invention.

FIG. 18 illustrates a sixth anticipated application of the circuit arrangements of FIG. 11 and/or FIG. 12.

In FIG. 18, a master lighting fixture MLFs, which is hard-wire-connected with an ordinary electric utility power line, is mounted in a suspended ceiling SCs. Lighting fixture MLFs includes a master power supply MPSs; which has four Class-2 power output ports OPs1/OPs2/OPs3/OPs4 plug-in connected by way of light-weight connect cords LWCCs1/LWCCs2/LWCCs3/LWCCs4 with Class-2-type light panels LPs1/LPs2/LPs3/LPs4, all respectively.

Master power supply MPSs corresponds to central power supply CPSy of FIG. 12, except that it includes provisions for powering the lamps included within the master lighting fixture. Each of light panels LPs1/LPs2/LPs3/Lps4 corresponds to lighting unit LUy1 of FIG. 12.

Figure 19:
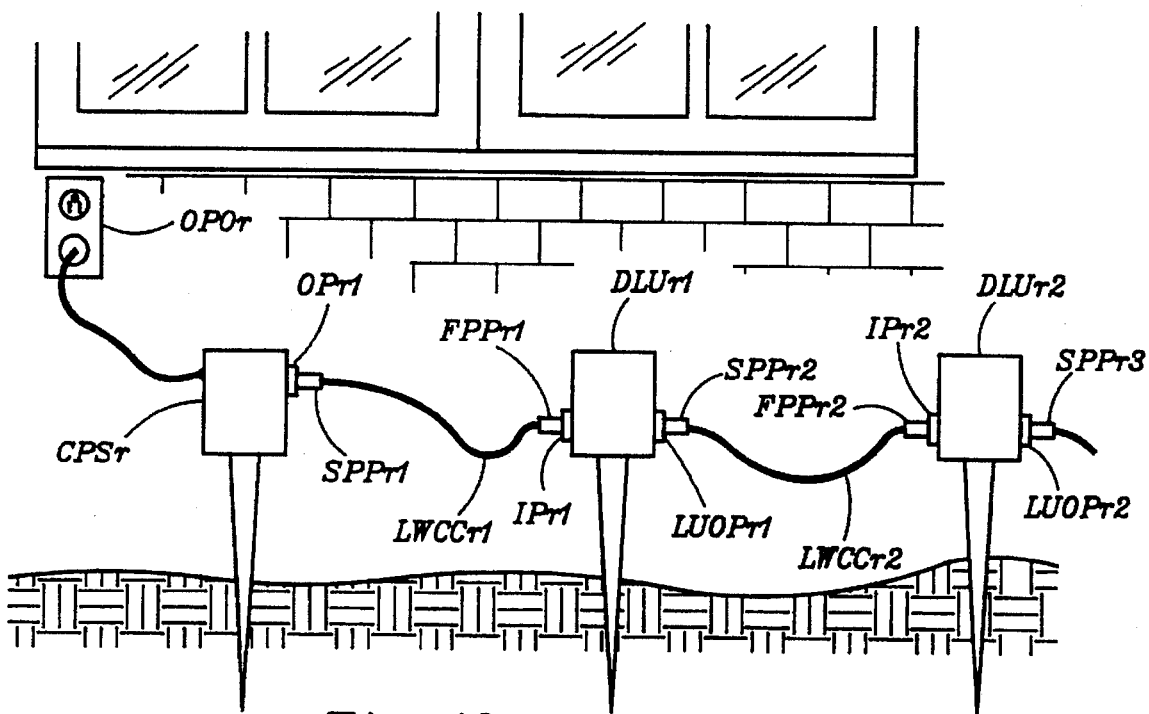
FIG. 19 schematically illustrates the seventh anticipated application of the third initially preferred embodiment of the invention.

FIG. 19 illustrates a seventh anticipated application of the circuit arrangements of FIG. 11 and/or FIG. 12.

In FIG. 19, central power supply CPSr, which is powered from an outside electric power outlet OPOr, is mounted on a spike placed into the ground in a flower bed near a house. Central power supply CPSr has at least one 35 kHz Class-2 power output port OPrl into which is plugged a special power plug SPPr1 connected with a first light-weight connect cord LWCCr1 which has a female-type power plug FPPr1 at its far end; which power plug FPPr1 is plugged into an input port IPr1 of a first low-power decorative lighting unit DLUr1; which lighting unit DLUr1 has an output port LUOPr1 into which is plugged a special power plug SPPr2 connected with a second light-weight connect cord LWCCr2 which has a female-type power plug FPPr2 at its far end; which power plug FPPr2 is plugged into an input port IPr2 on a second decorative lighting unit DLUr2; which has an output port LUOPr2 into which is plugged a special power plug SPPr3 connected with a third light-weight connect cord LWCCr3, etc.

Central power supply CPSq is equivalent to central power supply CPSx of FIG. 11.

Each of decorative lighting units DLUr1/DLUr2/etc. is equivalent to lighting unit LUx1 of FIG. 11.

Figure 20:
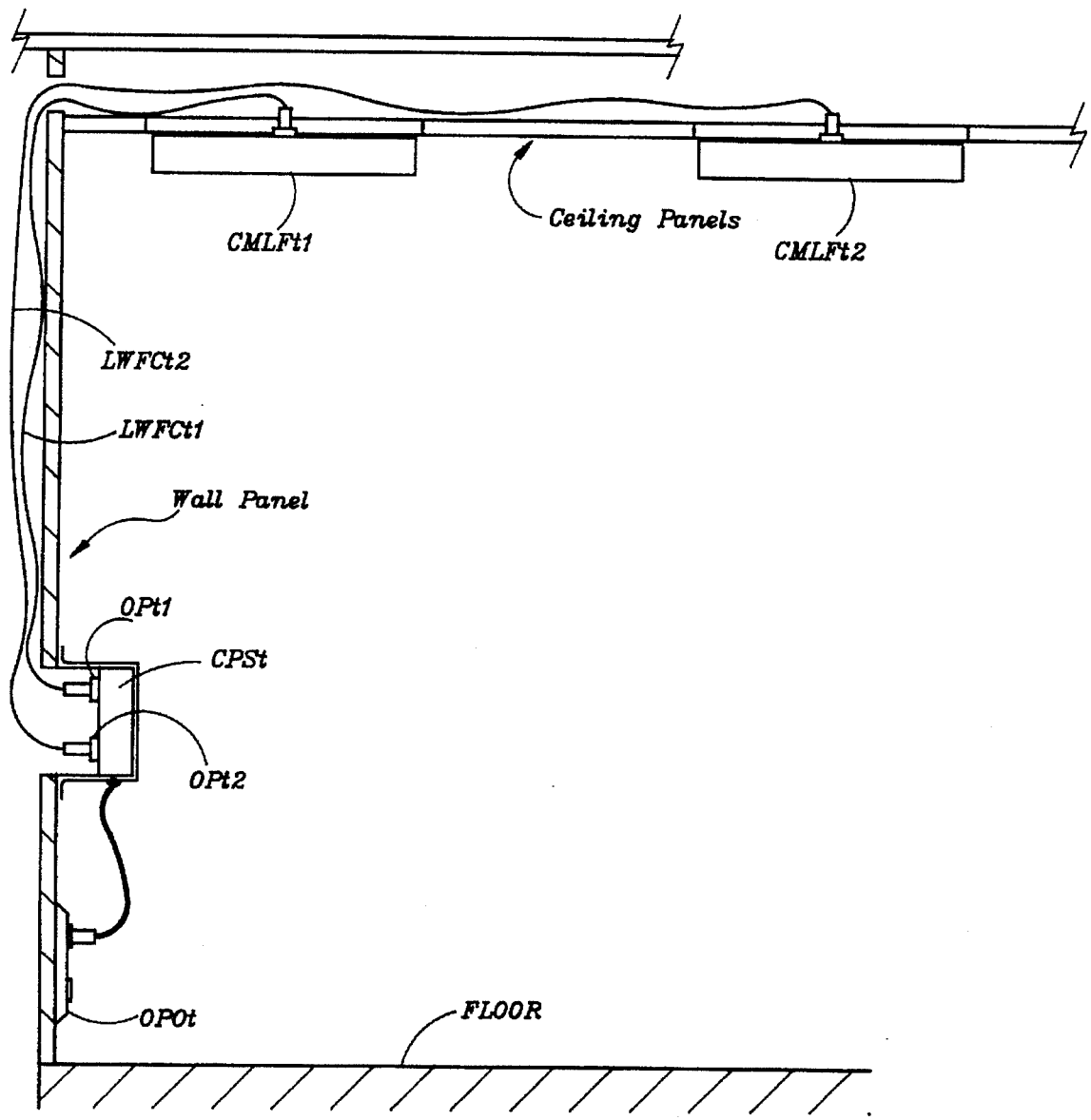
FIG. 20 schematically illustrates the eighth anticipated application of the third initially preferred embodiment of the invention.

FIG. 20 illustrates an eighth anticipated application of the circuit arrangements of FIG. 11 and/or FIG. 12.

In FIG. 20, a central power supply CPSt, which is plug-in connected with an ordinary household electrical power outlet OPOt, has plural Class-2 output ports OPt1/OPt2/etc. Central power supply CPSt is mounted on a wall with its output ports located on the side facing the wall. Hidden behind the wall surface covering (e.g., underneath wall panels) as well as behind the ceiling surface covering (e.g., underneath ceiling panels) are light-weight flexible flat power cords LWFCt1/LWFCt2/etc. plug-in-connected between ceiling-mounted lighting fixtures CMLFt1/CMLFt2/etc. and the Class-2 output ports OPt1/OPt2/etc. on the back of central power supply CPSt, all respectively.

Due to the Class-2 nature of the power provided from output ports OPt1/OPt2/etc., connection between each output port and its associated load can be done without concern for fire-initiation hazard and/or electric shock hazard; which implies that it is safe and appropriate to route connection conductors in whatever manner might be found desirable.

As a result of their light-weight and flat nature, connect cords LWFCt1/LWFCt2/etc. can conveniently and inconspicuously be routed underneath ordinary wall panels and/or ceiling panels.

The circuit arrangement of central power supply CPSt is equivalent to that central power supply CPSy of FIG. 12.

Each ceiling-mounted lighting fixture CMLFs1/CMLFs2/etc. has an electric circuit arrangement equivalent to that of lighting unit LUy1 of FIG. 12.

Additional Comments re Third Initial Preferred Embodiment (aa) In lighting unit LUy1 of FIG. 12, fluorescent lamp FLy1 is shown to be an instant-start lamp (e.g., the lamp has thermionic cathodes but can be properly ignited without cathode preheating). However, a rapid-start fluorescent lamp may just as well be used, except that it be then necessary to pre-heat the cathodes by providing a cathode pre-heating voltage to each cathode. Such pre-heating voltage can readily be provided by adding to ballasting transformer BTy1 an auxiliary winding for each cathode and by connecting the output from each of those windings to one of the cathodes. To maximize lamp efficacy, these auxiliary windings should be added on the output side of the transformer; which would automatically provide for the magnitude of the cathode heating voltage to drop after lamp ignition.

(ab) In central power supplies CPSx or CPSy of FIGS. 11 and 12, fusible links FLxa/FLxb and/or FLya/FLyb may be substituted with electronic means for limiting the magnitude of the current that can be drawn from output terminals POTxa/POTxb and/or POTya/POTyb, all respectively. For instance, the primary winding of a tiny current transformer may be substituted for fusible link FLxa, and the output from the secondary winding of this current transformer may be applied to a resistor, thereby generating a voltage with a magnitude proportional to the magnitude of the current drawn from the output terminals. The voltage across this resistor may be rectified, and the resulting DC voltage applied to a break-down device, such as a Diac, via an RC integrating circuit. On reaching a sufficiently high magnitude, the Diac breaks down and causes a device, such as a field-effect transistor, suddenly to become switched ON; which effect, in turn, may be used for stopping the inverter's oscillations, such as by providing for a short-circuit between the gate/source terminals of each of the two inverter transistors having their source terminals connected together.

Thus, if a current of excessive magnitude be drawn from central power supply CPSx, the power supply's inverter becomes disabled, thereby interrupting the flow of output current.

(ac) In respect to the neon-lamp-type, alpha-numeric modules of FIG. 17, an anticipated attractive option is one whereby each of the modules is plugged into and held by a common power track (i.e., a power track similar to what is usually used in a track lighting system). The track conductors of this power track, which are connected with the output terminals of central power supply CPSq, will then provide power to each individual alpha-numeric module plugged thereinto.

Whereas an ordinary full-function neon sign (e.g., NSp1 of FIG. 16) would typically draw nearly 100 Watt, each individual one of the alpha-numeric modules would draw only about 10 Watt; in which case as many as ten modules may be connected to a track powered from a central power supply such as CPSx of FIG. 11. However, when powering the alpha-numeric modules from a power track, there would be no need to provide a particular limit on the power available from the central power supply.

In these alpha-numeric modules, the length of each individual neon tube will be relatively short. Thus, it will be advantageous for the neon tubes used in these modules to have pre-heated thermionic cathodes rather than the usual cold emission cathodes.

(ad) The term "sinusoidal waveform" is understood to mean a waveform that is approximately identical to a waveform whose instantaneous magnitude varies in accordance with the sine (or cosine) of an angle that increases linearly over time. For practical purposes herein, a sinusoidal current is an alternating current having no more than about 10% total harmonic distortion. Likewise, a sinusoidal voltage is an alternating voltage having no more than about 10% total harmonic distortion.

(ae) To make the circuit arrangements of FIGS. 11/12 function properly, it is necessary that the load current drawn from the high-frequency power output terminals (e.g., terminals POTxa/POTxb in FIG. 11) exhibit a high power factor, preferably 90% or higher. To attain such a high power factor in a situation where the ultimate load is a gas discharge lamp, it is necessary to provide for power-factor-correcting circuitry. In each of the loading elements of FIG. 11 (e.g., lighting unit LUx1), power factor correction is attained by powering the gas discharge lamp via an LC tank circuit tuned so as to have a natural resonance at or near the frequency of the high-frequency output voltage provided at the output terminals of central power supply CPSx. However, to attain sufficient power factor correction, the loaded Q-factor of the LC tank circuit has to be at least two.

(af) An important feature of the invention as illustrated in FIGS. 11/12 is that of maintaining a fairly high operating (i.e., loaded) Q-factor as loads are added/subtracted to/from the central power supply (e.g., CPSx of FIG. 11). That is, by way of example, without having any load connected, the LC tank circuit represented by tank-inductor TIx and (the commutated) tank-capacitor TCx of FIG. 12 has a fairly high Q-factor (e.g., higher than five), and the high-frequency voltage developing across tank-inductor TIx is (except for a certain degree of scewing resulting from the commutation of the tank-capacitor) almost perfectly sinusoidal.

However, loading the output with a purely resistive load will reduce the operating Q-factor of the central power supply's LC tank circuit, and will cause the waveform of the high-frequency output voltage to become distorted away from a sinusoidal waveform. In fact, as more and more resistive loading is added, the inverter will eventually cease self-oscillating.

On the other hand, when the added loading (i.e., each added element of loading) is of such nature as to include its own LC tank circuit tuned to the frequency of the high-frequency output voltage from the central power sypply, and when the operating Q-factor of the added load is higher than a certain minimum (e.g., higher than two), a substantially sinusoidal waveform and self-oscillation will both be maintained substantially irrespective of how much loading is added.

DESCRIPTION OF THE PRESENTLY PREFERRED EMBODIMENT

Re Construction of Presently Preferred Embodiment

Figure 21:
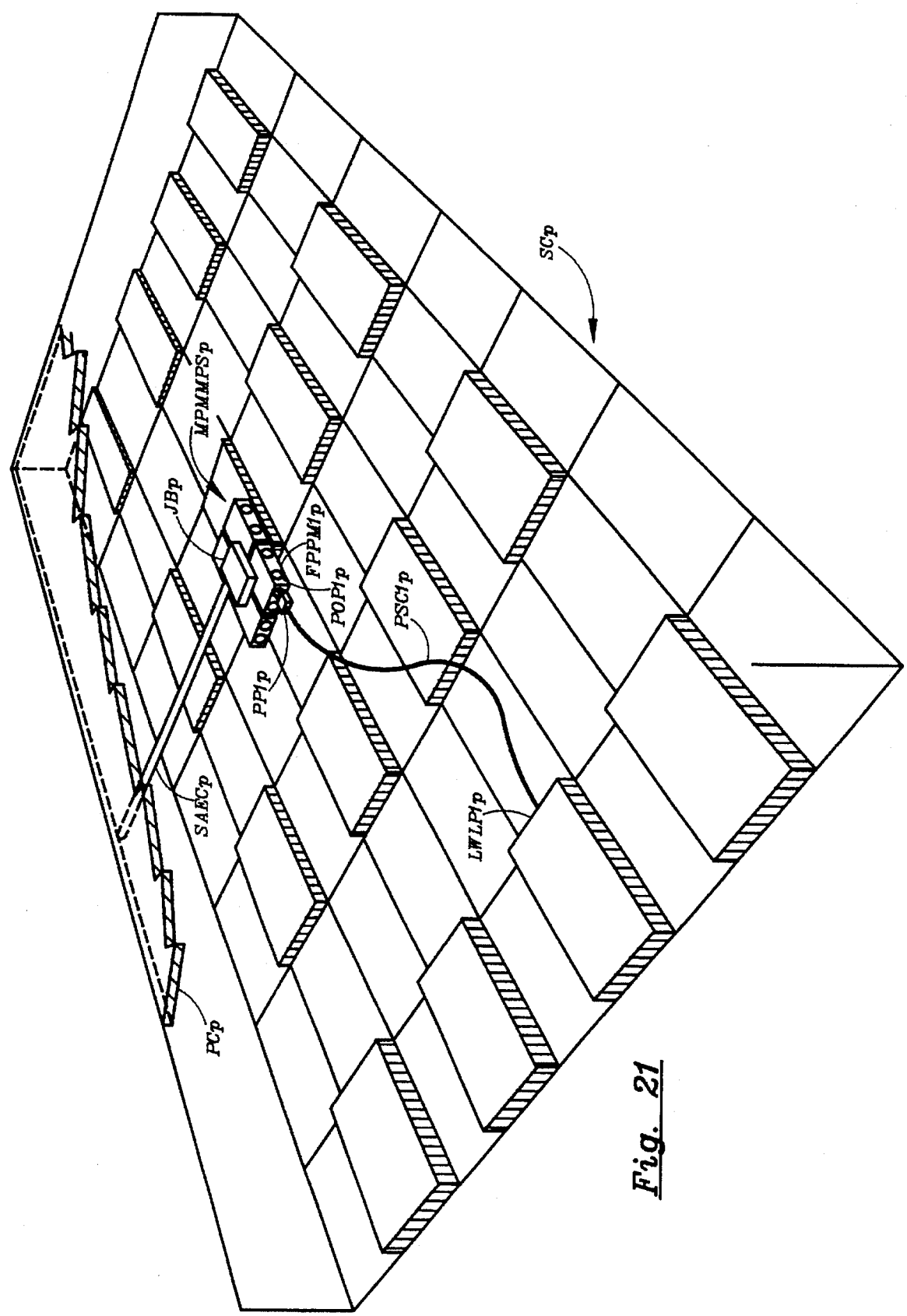
FIG. 21 illustrates a first version of the presently preferred embodiment of the invention.

FIG. 21 illustrates a first version of the presently preferred embodiment in the form of a lighting system installed in and above a suspended ceiling.

In FIG. 21, via steel-armored electrical conduit SAECp, a junction box JBp is supplied with power line voltage from a pair of power line conductors connected with an ordinary electric utility power line. Mounted near—and supported by junction box JBp (and/or by permanent ceiling PCp above suspended ceiling SCp) and in direct electrical connection with the power line conductors thereof—is a multi-port modular main power supply MPMMPSp; which multi-port modular main power supply MPMMPSp includes several (e.g., four) individual multi-port power modules (e.g., MPPM1$p$), each one having several (e.g., four) separate power output ports (e.g., POP1$p$).

Each separate power output port (e.g. PIP1$p$) is adapted to receive and disconnectably hold a power plug (e.g., PP1$p$) mounted at one end of a power supply cord (e.g., PSC1$p$), whose other end is disconnectably plug-in-connected with one of plural (e.g. , 16) light-of-weight lighting panels (e.g., LWLP1$p$) . Each of these lighting panels (e.g. , LWLP1$p$) is disconnectably connected, by way of a power supply cord (e.g., PSC1$p$), with one of the several power output ports (e.g., POP1$p$).

Figure 22:
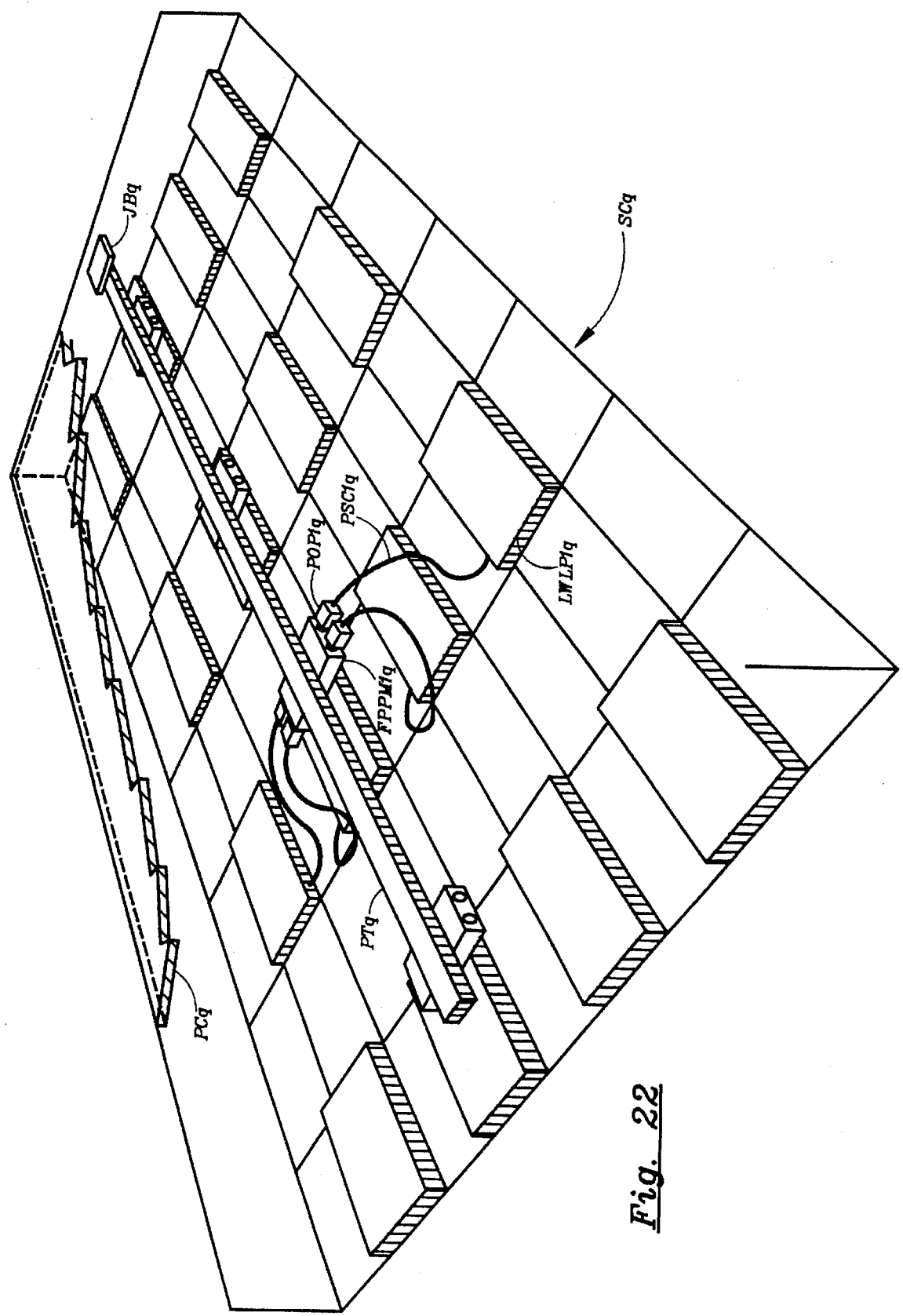
FIG. 22 illustrates a second version of the presently preferred embodiment.

FIG. 22 illustrates a second version of the presently preferred embodiment.

In FIG. 22, as in FIG. 21, each of the plural lighting panels (e.g., LWLP1$q$) is connected by way of a power supply cord (e.g., PSC1$q$) with a power output port (e.g., POP1$q$) of one of several (e.g., four) four-port power modules (e.g., FPPM1$q$). Each power module (e.g., FPPM1$q$) is disconnectably connected with power track PTq (in a manner similar to that by which a lighting unit is connected with a power track in an ordinary track lighting system). In turn, by way of junction box JBq, the power track's track conductors are connected with the power line voltage from an ordinary electric utility power line.

Figure 23:
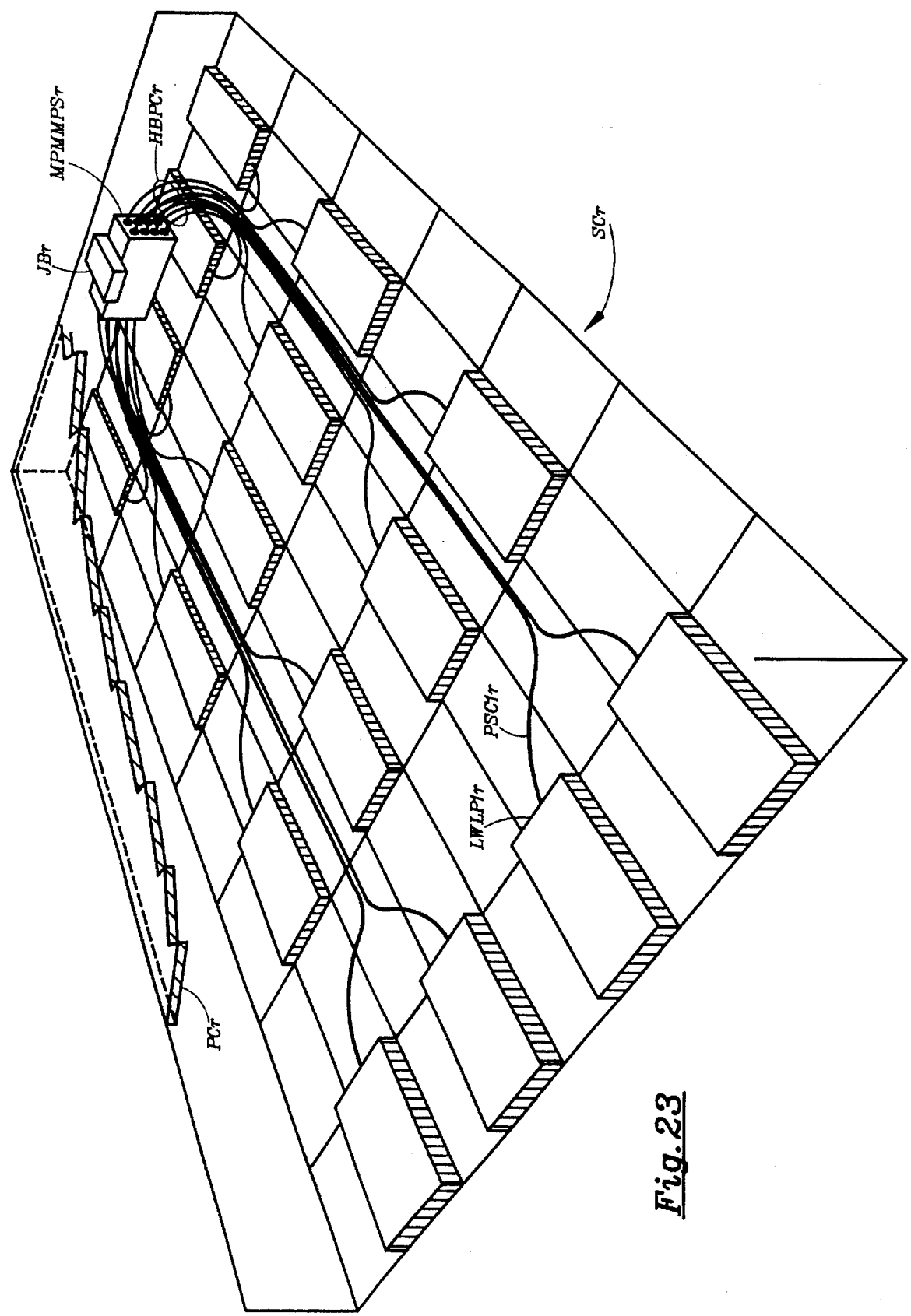
FIG. 23 illustrates a third version of the presently preferred embodiment.

FIG. 23 illustrates a third version of the presently preferred embodiment.

In FIG. 23, as in FIGS. 21, each of the plural lighting panels (e.g., LWLP1$r$) is connected via a power supply cord (e.g., PSC1$r$) with one of the plural (e.g., sixteen) power output ports (e.g., POP1$r$) of multi-port main power supply MPMPSr. Each lighting panel is connected directly with one of the multiple power output ports by way of a separate individual power cord contained within a harnessed bunch of power cords HBPCr extending from main power supply MPMPSr in a direction toward the lighting panels. In a predetermined manner, a power supply cord is branched out from harness HBPCr near the location of each lighting panel and plug-in-connected therewith.

With respect to the electrical circuitry and construction of the modular lighting systems of FIGS. 21 and 22, reference is made to the arrangements of FIGS. 11 and 12.

That is, in terms of electrical circuitry: (i) each one of the multi-port power supplies of FIGS. 21–23 (e.g., MPPm1$p$, FPPM1*q*, MPMPSr) is arranged similarly to central power supply CPSy of FIG. 12; and (ii) each one of the lighting panels (e.g., LWLP1*p*, LWLP1*q*, LWLP1*r*) is arranged similarly to lighting unit LUy1 of FIG. 12.

Re Operation of Presently Preferred Embodiment

In the arrangements of FIGS. 21–23, each one of the multi-port power modules (e.g., FPPM1*p*), as combined with its associated lighting loads (e.g., LWLPp, as powered via power supply cord PSC1P), basically functions like the arrangement of FIG. 12; which is to say:

(i) the high-frequency (e.g., 35 kHz) voltage output available from each individual power output port (e.g., POP1*p*) is manifestly limited in such manner as to represent a Class-3 (i.e., fire-initiation-safe) output;

(ii) any load (e.g., lighting panel LWLP1*p*) connected with such an individual power output port does not have to be physically protected from being damaged and/or short-circuited, (which would pose a fire-initiation risk), which is in sharp contrast with any situation where electric power is being supplied from a non-power-limited power output port; and (iii) just as with the arrangements of FIGS. 11/12, any number of loads may be connected with any one given power output port, as long as the resulting total loading on this given power output port does not exceed the level permitted by whatever current-limiting means is used for limiting the magnitude of the output current extractable from this given power output port.

In addition to the above-described fire-initiation-safety feature, another very important distribution-efficiency feature of the modular lighting system of FIGS. 21/22 is represented by the following discovered and verified fact: When powering lighting (or other) loads in the manner shown by FIG. 12, despite the high frequency of the voltage provided at each power output port, the overall system functions properly and efficiently almost irrespective of the lengths and/or nature of the power supply cords used for connecting the lighting loads to their respective power output ports. This distribution-efficiency feature results from two key factors:

(a) the provision of a substantially sinusoidal output voltage from each power output port; and (b) resonant energy-storage associated with each lighting load, thereby to cause each lighting load: (i) to have internally stored energy substantially higher than the maximum energy stored in the capacitance of the power supply cord; and (ii) to draw current from its associated power output port with a near unity power factor.

When combining the fire-initiation-safety feature and the distribution-efficiency feature, a particularly flexible and cost-effective lighting system results; which system is, in one of its different possible versions, illustrated by FIG. 21.

To understand and appreciate the advantages of the lighting system of FIG. 21 (hereinbelow sometimes referred-to as a New-type Lighting System), it is important to recognize key aspects of an ordinary suspended ceiling lighting system (hereinbelow sometimes referred-to as an Ordinary Lighting System). With general reference to the suspended ceiling and the distribution of lighting fixtures shown in FIG. 21, in an Ordinary Lighting System each one of the (sixteen) lighting fixtures would be directly connected to a junction box by way of an armored cable. Usually, four lighting fixtures would be connected with each junction box; which means that sixteen lighting fixtures would be associated with four junction boxes.

Due to the fire-initiation-hazards associated with circuits connected with ordinary non-power-limited power line voltages, to satisfy fire safety codes, the four junction boxes, the sixteen armored cables, and the sixteen lighting fixtures would all have to be installed by a licensed electrician. As a result, more than half of the net total cost of an installed Ordinary Lighting System is attributable to the cost of installation (including the cost of the parts used in installation)—the other half being attributable to the cost of the lighting fixtures themselves.

On the other hand, in the arrangement of FIG. 21, a single junction box serves all sixteen lighting fixtures; and only this single junction box (which would preferably be an integral part of the main power supply MPMMPSp) would have to be installed by a licensed electrician. Otherwise, installation of the sixteen ceiling lighting fixtures by way of the sixteen associated power supply cords could simply and safely be accomplished by a non-skilled person. As an overall result, on basis of an arrangement such as that of FIG. 21 (or FIG. 23), in a sixteen-fixture New-type Lighting System, the net total cost of installing the lighting fixtures (including the cost of the power supply cords and other small parts needed for installation) would be less than half that of a sixteen-fixture Ordinary Lighting System; which means that the net overall cost of the installed New-type Lighting System would be nearly thirty percent lower than that of the Ordinary Lighting System.

Additional Comments Presently Preferred Embodiment (ba) It has been found that: (i) the power supply cords (e.g., PSC1*p* of FIG. 21) may be as long as 100 feet each without giving rise to significant detrimental effects; (ii) the capacitance between the two power-carrying conductors in each power supply cord may be as high as 2500 pF (or even higher) without giving rise to significant detrimental effects; and (iii) the power supply cords may be bundled together without giving rise to significant detrimental effects.

(bb) In most fluorescent lighting systems for suspended ceilings, assuming the multi-port modular power supply to be centrally positioned, no single power supply cord need be longer than about 25 feet.

(bc) It is anticipated that various standard lengths of power supply cord will be provided, with each such cord having plug and receptacle means, thereby to be connectable with each other so as to permit convenient making-up of a power supply cord of any desired length.

(bd) Ordinary telephone-type connection cord (i.e., the kind usually used for connection between a telephone instrument and a telephone outlet) has been found to be acceptable as power supply cords in the lighting system of FIGS. 21–23. A 25 foot length of such telephone-type cord has a total capacitance of about 500 pF between its conductors and introduces no measurable power loss when supplying a lighting load with 100 Volt-Ampere.

(be) The capacitance associated with a power supply cord will have the effect of slightly reducing the frequency of the high-frequency voltage supplied to the lighting fixture to which it is connected; which, in turn, will reduce the amount of power drawn by the lighting fixture and thereby the amount of light provided therefrom. However, this effect can readily be compensated-for by correspondingly reducing the capacitance associated with the circuitry within the lighting fixture.

27

(bf) To avoid the variability resulting from having to use power supply cords of different lengths (and therefore of different capacitance values), it is anticipated that the power supply cords will include a built-in trim-capacitor, thereby to make every power supply cord exhibit the same total capacitance regardless of length.

(bg) It is also anticipated that, to provide for a useful degree of adjustability of the light output of each lighting fixture, different types of power distribution cords will be provided: (i) one type with a relatively high effective capacitance, which would result in a relatively low level of light output from the lighting fixture to which it is connected; and (ii) another type with a relatively low effective capacitance, thereby to result in a relatively high level of light output from the lighting fixture.

(bh) Alternatively and similarly, it is also anticipated that (at least in some applications) any desired additional capacitance will be provided in the form of a plug-in capacitor; which plug-in capacitor would preferably be arranged so as to permit a power supply cord to be plugged into it, while permitting the plug-in capacitor to be plugged into a lighting fixture or into another power supply cord.

In another more-or-less equivalent alternative arrangement, the lighting fixture is anticipated to be provided with an extra receptacle into which may be plugged a suitable capacitor operative to provide a degree of control and/or adjustment of the fixture's light output, with the degree of control/adjustment being dependent on the capacitance value represented by the plug-in capacitor.

(bi) It is anticipated that the power output ports as well as the power supply cords be coded (e.g., by colors and/or other markings) in such manner as to facilitate initial installation as well as subsequent modifications and/or repairs.

That is, such coding is beneficial in connection with tracing a given power output cord from power output port to lighting fixture, particularly in situations when plural power output cords are bundled together in the form of a wiring harness.

(bj) With reference to the arrangement of FIG. 12, the circuitry required to be included in/with every lighting fixture (or in/with every lighting panel, to use the nomenclature adopted in connection with FIGS. 21–23) is very compact and light-of-weight, and contains no parts of a kind that is likely to constitute a reliability and/or durability issue—as would semiconductors and/or electrolytic capacitors, for instance.

(bk) Since, by virtue of manifest limitation on the amount of current extractable from each individual power output port, the maximum power made available to each lighting fixture is so low as to be considered fire-initiation-safe. As a consequence of this fact, the lighting fixture itself does not have to provide for mechanical protection to protect from possible fire-initiation-hazards; which, in turn, means that the lighting fixture itself may be constructed in a much simpler and less expensive manner. Moreover, it implies that the weight of the fixture can be much lower.

(bl) The centrally located multi-port modular main power supply of FIG. 21 (MPMMPSp) is actually comprised of plural (e.g, four) multi-port power modules; each of which power modules is plug-in-connected with receptacles mounted on a common base structure; which receptacles are, in turn, connected with the power line conductors provided at junction box JBp.

28

Thus, the main power supply can be configured to match the number of lighting fixtures needed to be powered. With each power module having four power output ports, sixteen fixtures would require the installation of four such four-port power modules. If four more fixtures were to be added, one additional four-port power module would be plugged in and placed in use, etc.

(bm) In the arrangement of FIG. 22, the indicated power track PTq could be much shorter and located centrally. That way, the power track would serve the function of said base structure of FIG. 21.

In fact, the base structure referred-to in connection with FIG. 21 may be considered as being just such a short piece of power track, whose track conductors is connected with the power line conductors at junction box JBp.

(bn) In the IEEE Standard Dictionary of Electrical and Electronics Terms (Second Edition), as pertaining to interior electric wiring and as used herein, the term "junction box" is defined as "a box with a blank cover that serves the purpose of joining different runs of raceway or cable and provides space for the connection and branching of the enclosed conductors".

It is emphasized that said "blank cover" is removable and may be replaced by a properly fitted electrical load; which is indeed what is anticipated in some of the arrangements herein disclosed.

Usually, non-current-limited power line voltage is supplied to a junction box by way of a pair of insulated electrical conductors fed through a metallic conduit. The conduit and the junction box each constitutes a fire-proof enclosure; which, to minimize fire-initiation-hazard, is usually required by electrical codes wherever non-current-limited power line voltage is present between two electrical conductors.

(bo) In the centrally located multi-port modular main power supply MPMMPSp of FIG. 21, each of the separate multi-port power modules (e.g., MPPM1$p$)— each being made in accordance with the arrangement of FIG. 12—includes its own self-oscillating inverter whose frequency of oscillation is determined by the detailed characteristics of the circuit components of which it consists, the frequency of the AC output voltages from these power modules will—barring the introduction of an overt synchronizing mechanism— not be equal to each other.

Moreover, the oscillating frequency of each individual power module will be determined to a significant degree by the characteristics of the loads connected with its output ports. For instance, adding a capacitor across its output terminals will cause the frequency of the AC output voltage to decrease; adding an inductor thereacross will cause the frequency to increase.

(bp) When the load added to each of the output ports of a given power module includes as much effective parallel-connected capacitance and it does parallel-connected inductance, the net effect on the frequency of oscillation will be zero. Also, in such a case, the power factor of the ccurrent drawn by the load with then be 100%.

(bq) In order to maintain a sufficiently high degree of utility of the lighting systems of FIGS. 21–23, it is imperative that each load draws its load current with a relatively high power factor. A power factor of 75% is anticipated as representing a minimum acceptable level.

(br) To minimize the effect of differences in conductor-to-conductor capacitance in the power distribution or supply cords, it is important that the effective parallel-capacitance represented by a given load (e.g., capacitor TCy1 of FIG. 12) be substantially higher than that represented by its associated power distribution cord (e.g., DCy1 of FIG. 12).

(bs) Because they are each powered from a fire-initiation-safe (i.e., properly power-limited) source, the lighting panels of FIGS. 21–23 (e.g., LWLP1p of FIG. 21) can safely be constructed in a manner wholly different from what is required with respect to an ordinary lighting fixture designed to be powered directly from a non-power-limited power line voltage.

Thus, each of the lighting panels associated with the lighting systems or arrangements illustrated by FIGS. 21–23 is preferably made of a particularly light-of-weight construction. In fact, such a lighting panel need have no more physical strength or fire-resistance that those of an ordinary ceiling panel used in an ordinary suspended ceiling.

In particular and by way of example, it is anticipated that each lighting panel be made as a single-piece plastic housing formed (e.g., vacuum-formed) and constituted so as to hold, and act as a reflector for, plural (typically three four-foot T-8) fluorescent lamps, with one side of the housing (i.e., the bottom) being translucent and functioning as the "lens" (i.e., light diffuser).

Alternatively, the panel can be formed of relatively light-weight glass, with the reflective material deposited directly thereonto, and with the front (i.e., bottom) being fully translucent. Thus, in one preferred embodiment, a lighting panel made according to instant invention would be much like a "sealed-beam" lamp, with the individual fluorescent lamps existing within a sealed enclosure of glass, thereby to remain particularly free of dust accumulation, etc.

In either case, due to the utter simplicity of construction, a lighting panel can be constructed so economically as to constitute a throw-away entity, thereby making re-lamping a partivcularly simple and low-cost task.

Of course, the high-frequency matching circuit required to be used with each lighting panel (e.g., equivalent to elements TCy1, PWy1, OWy1, BTy1, CLIy1 of lighting unit LUy1 of FIG. 12) would be made as a detachable/disconnectable/re-useable entity.

I claim:

1. An arrangement comprising:
    plural frequency-converting power supplies mounted at a first location; each such power supply (i) being powered from ordinary power line voltage provided from an electric utility power line, and (ii) having plural power output ports at each of which is supplied a substantially sinusoidal AC voltage of frequency distinctly higher than that of said power line voltage; each power supply having a sub-circuit connected therewithin and operative to limit the amount of power extractable from each power output port to a level so low that any passive load connected therewith would not constitute a fire-initiation hazard; and
    plural lighting units; each lighting unit located some distance away from the first location and including: (i) a power input port; (ii) a gas discharge lamp; (iii) a sub-assembly connected in circuit between the gas discharge lamp and the power input port; and (iv) a power supply cord connected between the power input port and one of the plural power output ports.

2. The arrangement of claim 1 wherein said sub-circuit is additionally characterized by being operative to limit the amount of power extractable from each power output port to a level not higher than 100 Watt.

3. The arrangement of claim 1 wherein the plural frequency-converting power supplies are each connected with and powered from said ordinary power line voltage by way of a common junction box.

4. The arrangement of claim 1 wherein each power supply cord has a pair of conductors and is further characterized by having substantially the same capacitance as measured between its pair of conductors.

5. The arrangement of claim 1 wherein the power supply cords may be of different lengths yet exhibit between its conductors substantially the same amount of capacitance.

6. The arrangement of claim 1 wherein: (i) said ordinary power line voltage is provided at a pair of power line conductors disposed within a junction box; and (ii) said first location is defined as being contained within a distance of six feet from the junction box.

7. The arrangement of claim 1 wherein at least several of the power supply cords are bundled together to form a single cable entity consisting of plural separate pairs of conductors.

8. The arrangement of claim 1 wherein the plural frequency-converting power supplies are characterized in that the frequency of the AC voltage supplied at a power output port of one of those power supplies is non-synchronous with respect to the frequency of the AC voltage supplied at a power output port of another one of those power supplies.

9. The arrangement of claim 1 wherein each of the plural frequency-converting power supplies is further characterized by including a self-oscillating inverter circuit.

10. An arrangement comprising:
    plural power supplies; each power supply (i) being powered from an ordinary power line voltage supplied at a pair of power line conductors disposed within a given junction box, (ii) being located not more than six feet from said junction box, and (iii) having plural power output ports at each of which is supplied an AC voltage of frequency distinctly higher than that of the power line voltage; each power supply also having a sub-circuit connected therewithin and operative to limit the amount of power extractable from each power output port to a level sufficiently low so as not to represent a fire-initiation hazard; and
    plural lighting units; each lighting unit located more than six feet away from the junction box and including: (i) a power input port; (ii) a gas discharge lamp; (iii) an assembly connected in circuit between the power input port and the gas discharge lamp; and (iv) a power supply cord connected between the power input port and one of the power output ports.

11. The arrangement of claim 10 wherein each power supply is further characterized in that its sub-circuit is operative to limit the amount of power extractable from each power output port to a level not higher than 100 Watt.

12. An arrangement comprising:
    a power line source providing a power line voltage at a pair of power line terminals; the power line source being further characterized in that it is functional to provide a current of substantially non-limited magnitude from the power line terminals, thereby causing the amount of power extractable from the power line terminals to be substantially non-limited and therefore to constitute a potential fire-initiation-hazard;
    a power conditioner having input terminals connected with the power line terminals; the power conditioner having plural output ports at each of which is provided a substantially sinusoidal AC output voltage of frequency distinctly higher than that of the power line voltage; the power conditioner being further characterized in that each output port is (i) connected with a current-limiting sub-circuit, (ii) functional to supply an output current of frequency equal to that of the AC output voltage, (iii) manifestly prevented from supplying such output current at a magnitude higher than a certain level, thereby not to constitute a fire-initiation-hazard; and a load assembly characterized by including (i) an input port connected with one of the output ports, (ii) a matching circuit, and (iii) a gas discharge lamp connected with the input port by way of the matching circuit; the load assembly being further characterized by drawing a substantially sinusoidal current from said one of the output ports.

13. The arrangement of claim 12 additionally comprising a power supply cord disconnectably connected between said one output port and said input port.

14. The arrangement of claim 12 additionally comprising:
additional load assemblies, each characterized by including (i) an input port connected with one of the output ports, (ii) a matching circuit, and (iii) a gas discharge lamp connected with the input port by way of the matching circuit; and
plural power supply cords; each individual power supply cord being connected between one of the output ports and one of the input ports.

15. The arrangement of claim 14 additionally comprising a permanent ceiling as well as a suspended ceiling disposed some distance below the permanent ceiling; the power line terminals being disposed in or near the permanent ceiling, some distance above the suspended ceiluing; each load assembly being disposed at different spaced-apart locations in the suspended ceiling.

16. The arrangement of claim 12 wherein the power conditioner includes plural power modules; each power module having several output ports at each of which is provided a substantially sinusoidal AC output voltage.

17. An arrangement comprising:
a suspended ceiling disposed some distance below a permanent ceiling;
a power line source providing a power line voltage at a pair of power line terminals disposed at or near the permanent ceiling;
a power conditioner having input terminals connected with the power line terminals; the power conditioner being an integral entity disposed at a central location above the suspended ceiling; the power conditioner having plural output ports at each of which is provided a substantially sinusoidal AC output voltage of frequency distinctly higher than that of the power line voltage; and
a load assembly for each of the plural output ports; each load assembly characterized by: (i) being disposed at a different location in the suspended ceiling; (ii) having an input port connected with one of the output ports; (ii) including a matching circuit and a gas discharge lamp connected with the input port via this matching circuit; and (iv) drawing a load current from its associated output port, which load current being drawn with a power factor of at least 75%.

18. The arrangement of claim 17 wherein the central power conditioner is further characterized in that the frequency of the AC voltage provided at a first one of the plural output ports is distictly different from tne frequency of the AC voltage provided at a second one of the plural output ports.

19. The arrangement of claim 17 additionally characterized in that the frequency of the AC voltage provided at a given one of the output ports is affected by the particular nature of the load assembly connected with therewith.

20. The arrangement of claim 17 additionally characterized in that the frequency of the AC voltage provided at a given one of the output ports is reduced when connecting a capacitive load in parallel with the load assembly connected therewith.

21. An arrangement comprising:
a source operative to provide an AC voltage at each of plural output ports;
plural lighting loads, each having: (i) an input port; (ii) a gas disharge lamp; and (iii) a matching sub-assembly connected between the input port and the gas discharge lamp; and
a cable harness having plural pairs of conductors; one pair of these conductors being connected with each one of the plural output ports as well as with the input port of one of the plural lighting loads; the cable harness being further characterized in that the plural pairs of conductors are bundled together.

22. The arrangement of claim 21 wherein the AC voltage is characterized by being of frequency higher than 10 kHz.

23. The arrangement of claim 21 wherein the source is further characterized by including a current-limiting sub-assembly connected in circuit with each output port, thereby to limit the power extractable from each one output port to a level not exceeding 100 Watt.

24. The arrangement of claim 23 wherein the matching sub-assembly of each lighting load includes a reactive impedance functional to limit the current supplied to the gas discharge lamp such that the amount of power supplied to the lamp is distinctly lower than 100 Watt.

25. The arrangement of claim 21 wherein the cable harness is further characterized by extending from the location of the source to the location of each of the plural lighting loads.

26. The arrangement of claim 21 additionally comprising:
a permanent ceiling; the source being mounted on this permanent ceiling; and
a suspended ceiling disposed some distance below the permanent ceiling; the plural lighting loads being mounted at spaced-apart locations in the suspended ceiling.

27. The arrangement of claim 21 wherein the matching sub-assembly of each lighting load is further characterized by including a step-up voltage transformer, thereby to deliver to the lamp a voltage of magnitude higher than that of the AC voltage.

28. An arrangement comprising:
a permanent ceiling;
a false ceiling suspended from the permanent ceiling some distance therebelow; the false ceiling including a frame structure with rectangular apertures; and
a lighting panel placed into each of a number of the apertures; each lighting panel being characterized by:
 (a) including: (i) a power input port; (ii) a fluorescent lamp; and (iii) a matching sub-assembly connected in circuit between the power input port and the fluorescent lamp; and
 (b) being functional to draw high-frequency current from a high-frequency AC voltage supplied to its power input port; the high-frequency current being drawn in such manner as to result in power being absorbed by the lighting panel at a power factor of at least 75%; the frequency of the high-frequency voltage being higher than 10 kHz.

29. The arrangement of claim 28 additionally comprising a central power supply mounted in or on the permanent ceiling; the central power supply being further characterized by having plural power output ports; each power output port being connected with one of the power input ports.

30. The arrangement of claim 29 wherein the central power supply is further characterized by: (i) being connected with the power line voltage of an ordinary electric utility power line, which is capable of supplying more than 1000 Watt of power; and (ii) including a current-limiting sub-circuit connected with each power output port, thereby to manifestly prevent more than 100 Watt of power from being drawn therefrom.

31. The arrangement of claim 29 wherein the central power supply is further characterized by: (i) being connected with the power line voltage of an ordinary electric utility power line, which is capable of supplying more than 1000 Watt of power; and (ii) including plural power modules, each connected with the power line voltage and characterized by having several of the plural power output ports.

32. The arrangement of claim 28 wherein:

(a) the rectangular apertures are of substantially equal size and shape; and (b) each given lighting panel is located at least one aperture away from its nearest other lighting panel.

33. An arrangement comprising:

a permanent ceiling;

a central power supply characterized by including several power supply modules; each power supply module being connected with the power line voltage of an ordinary electric utility power line and functional to provide a high-frequency AC voltage at each of plural power output ports; each high-frequency AC voltage so supplied being of frequency distinctly higher than that of the power line voltage; each power supply module being otherwise characterized by: (i) being capable of operating independently of the other power supply modules; (ii) including a self-oscillating frequency-converting sub-assembly; and (iii) causing the frequency of the AC voltage provided at its output ports to be non-identical to that of the AC voltage provided at the output port of another one of the plural power supply modules;

a false ceiling suspended from the permanent ceiling some distance therebelow; the false ceiling including a frame structure with rectangular apertures; and a lighting panel placed into each of a number of the rectangular apertures; each lighting panel being characterized by including: (i) a power input port connected with one of the power output ports; (ii) a fluorescent lamp; and (iii) a matching sub-assembly connected in circuit between the power input port and the fluorescent lamp.

34. An arrangement comprising:

a central power supply characterized by including several power supply modules within an integral structure; each power supply module being powered from the power line voltage of an ordinary electric utility power line and functional to provide a high-frequency AC voltage at each of plural power output ports; each high-frequency AC voltage so supplied being of frequency distinctly higher than that of the power line voltage; each power supply module being otherwise characterized by: (i) being capable of operating independently of each other power supply module; (ii) including a self-oscillating frequency-converting sub-assembly; and (iii) causing the frequency of the AC voltage provided at its output ports to be non-identical to that of the AC voltage provided at the output ports of another one of the plural power supply modules; and plural lighting fixtures, each including: (i) a power input port connected with one of the power output ports; (ii) a fluorescent lamp; and (iii) a matching-circuit connected between the power input port and the fluorescent lamp.

* * * * *